(12) United States Patent
Li

(10) Patent No.: US 8,350,754 B2
(45) Date of Patent: Jan. 8, 2013

(54) ROBUST AND BROADBAND SIGNAL PROCESSING USING REPLICA GENERATION APPARATUS

(76) Inventor: Ming-Chiang Li, Mitchellville, MD (US)

( * ) Notice: Subject to any disclaimer, the term of this patent is extended or adjusted under 35 U.S.C. 154(b) by 287 days.

(21) Appl. No.: 11/231,841

(22) Filed: Sep. 22, 2005

(65) Prior Publication Data

US 2006/0066471 A1 Mar. 30, 2006

Related U.S. Application Data

(60) Provisional application No. 60/614,046, filed on Sep. 30, 2004.

(51) Int. Cl.
 *G01S 13/00* (2006.01)
 *G01S 17/00* (2006.01)
(52) U.S. Cl. .......... 342/189; 342/89; 342/175; 356/28.5
(58) Field of Classification Search ............... 342/25 R, 342/189
 See application file for complete search history.

(56) References Cited

U.S. PATENT DOCUMENTS

| | | | | |
|---|---|---|---|---|
| 3,798,590 A * | 3/1974 | Jacobson et al. | | 367/90 |
| 4,725,728 A * | 2/1988 | Brininstool et al. | | 356/35.5 |
| 4,915,498 A * | 4/1990 | Malek | | 356/5.04 |
| 5,420,826 A * | 5/1995 | Abramovitz | | 367/100 |
| 5,589,929 A * | 12/1996 | Li | | 356/5.01 |
| 5,768,306 A * | 6/1998 | Sawahashi et al. | | 375/150 |
| 5,955,989 A * | 9/1999 | Li | | 342/368 |
| 6,011,506 A * | 1/2000 | Li | | 342/54 |
| 6,028,883 A * | 2/2000 | Tiemann et al. | | 375/150 |
| 6,118,808 A * | 9/2000 | Tiemann et al. | | 375/142 |
| 6,151,353 A * | 11/2000 | Harrison et al. | | 375/136 |
| 6,232,922 B1 * | 5/2001 | McIntosh | | 342/453 |
| RE37,561 E * | 2/2002 | Li | | 356/5.01 |
| 6,356,602 B1 * | 3/2002 | Rodal et al. | | 375/344 |
| 6,369,753 B1 * | 4/2002 | Schucker et al. | | 342/357.12 |
| 6,407,699 B1 * | 6/2002 | Yang | | 342/357.12 |
| 6,437,728 B1 * | 8/2002 | Richardson et al. | | 342/90 |
| 6,469,778 B2 * | 10/2002 | Asaka et al. | | 356/28.5 |
| 6,512,720 B1 * | 1/2003 | Yang | | 367/134 |
| 6,546,256 B1 * | 4/2003 | Maloney et al. | | 455/404.2 |
| 6,611,336 B1 * | 8/2003 | Walmsley et al. | | 356/450 |
| 6,738,133 B1 * | 5/2004 | Yin | | 356/218 |
| 6,850,558 B1 * | 2/2005 | Eerola et al. | | 375/150 |
| 6,930,634 B2 * | 8/2005 | Peng et al. | | 342/357.01 |
| 2002/0033766 A1 * | 3/2002 | Pratt | | 342/357.06 |
| 2002/0067307 A1 * | 6/2002 | Lin et al. | | 342/357.12 |
| 2002/0069016 A1 * | 6/2002 | Lin et al. | | 701/213 |
| 2003/0129996 A1 * | 7/2003 | Maloney et al. | | 455/456 |
| 2004/0013175 A1 * | 1/2004 | Tanaka | | 375/149 |
| 2004/0227949 A1 * | 11/2004 | Dorrer et al. | | 356/450 |
| 2005/0147191 A1 * | 7/2005 | Geier et al. | | 375/344 |

* cited by examiner

*Primary Examiner* — John B Sotomayor
*Assistant Examiner* — Matthew M Barker

(57) ABSTRACT

Embodiments of the present invention are low cost, robust, broadband, optimum, high precision methods and apparatus of processing pulsed, transient, non-cooperative, non-reproducible, complex, or simultaneous signals based on correlation measurements utilizing optical RF signal train generators. An embodiment of the inventive apparatus comprises: (a) a signal receiving apparatus which receives one or more signals, and outputs the signals; (b) a replica generation apparatus, which comprises one or more RF signal train generators, accepts signals from the receiving apparatus as inputs, and outputs trains of replica pairs, where relative separations between two members in the replica pairs are same or different; and (c) an integration apparatus which performs Doppler, self, or mutual (cross) correlation operations on the replica pairs at RF or optical level. The apparatus of present invention advance interferoceivers of prior art, and overcome deficiencies of radar receivers, channelized receivers, electronic warfare receivers, spectrum analyzers, sampling oscilloscopes, and many others.

20 Claims, 22 Drawing Sheets

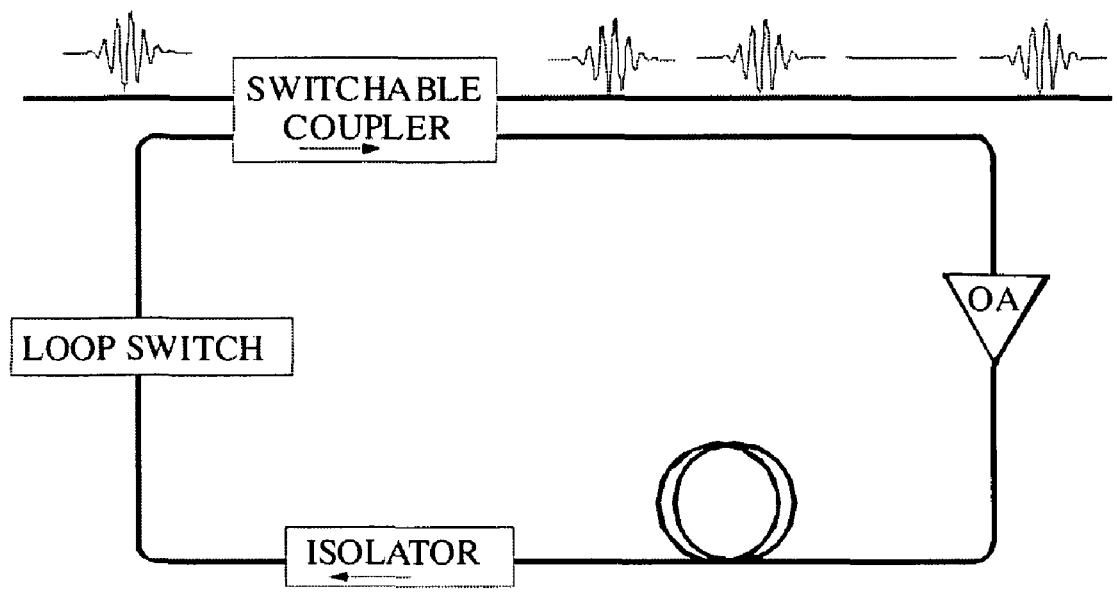
FIG. 1001
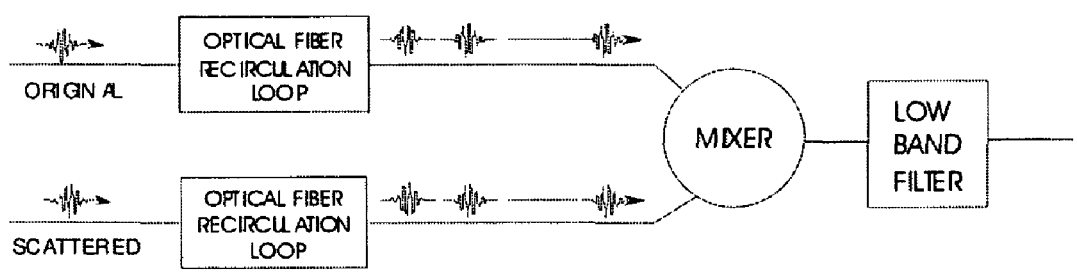
FIG. 1002

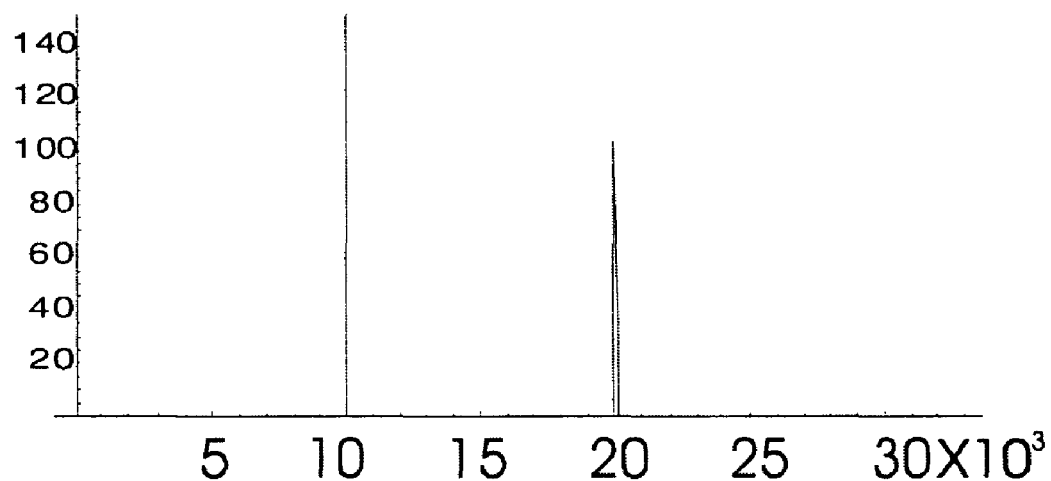
FIG. 1003
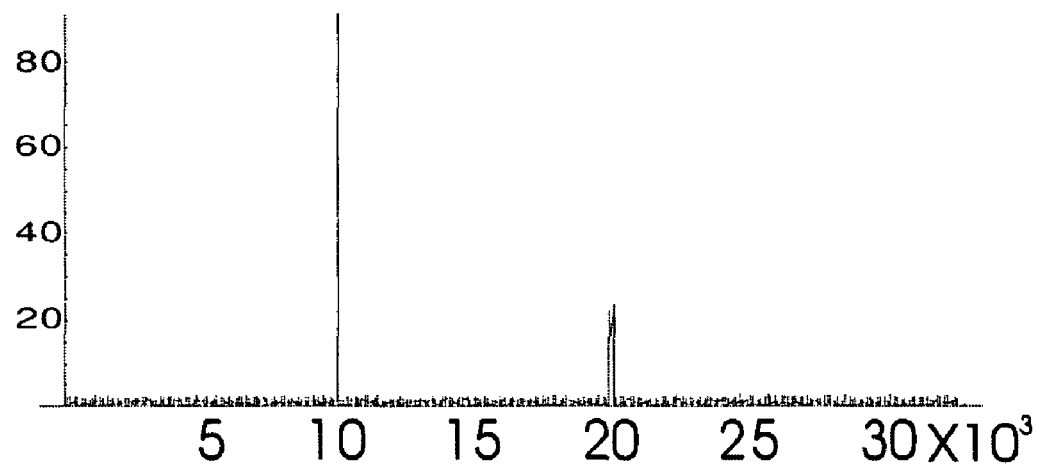
FIG. 1004

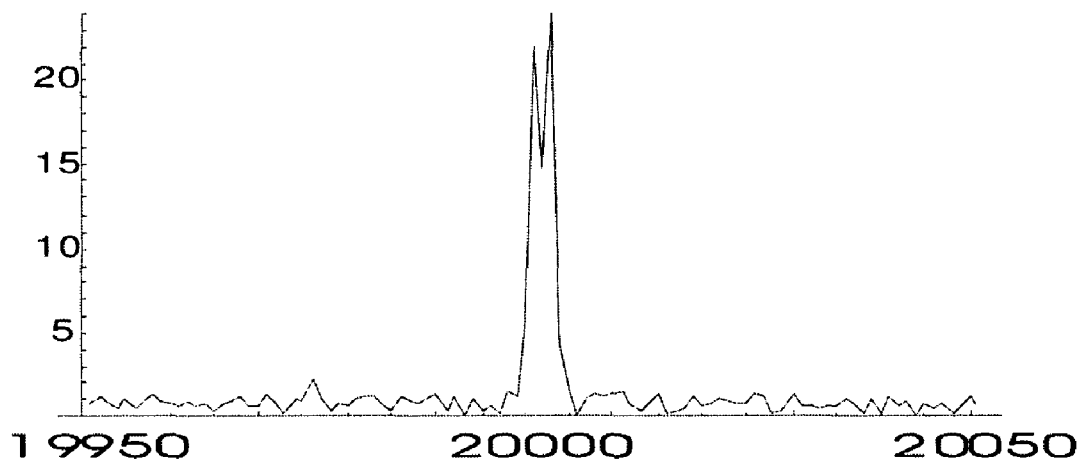
FIG. 1005
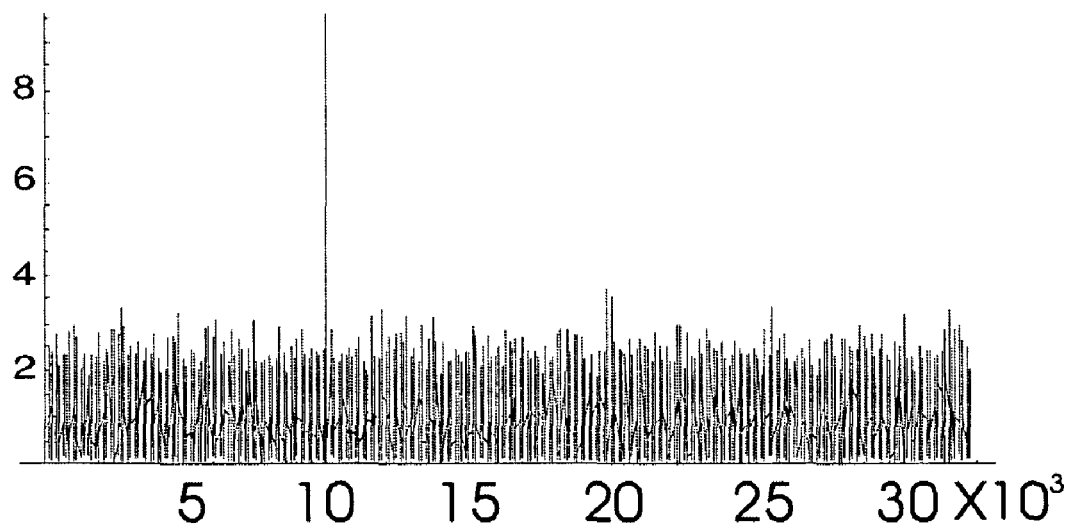
FIG. 1006

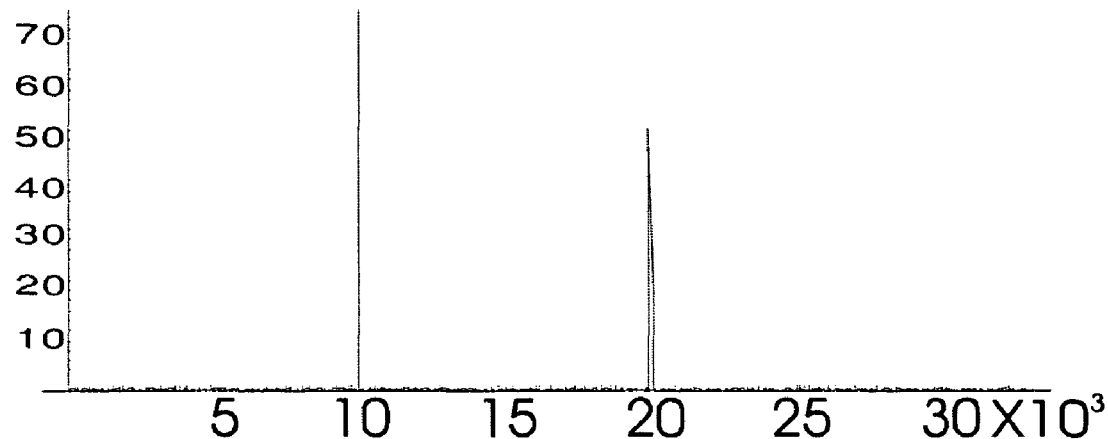
FIG. 1007
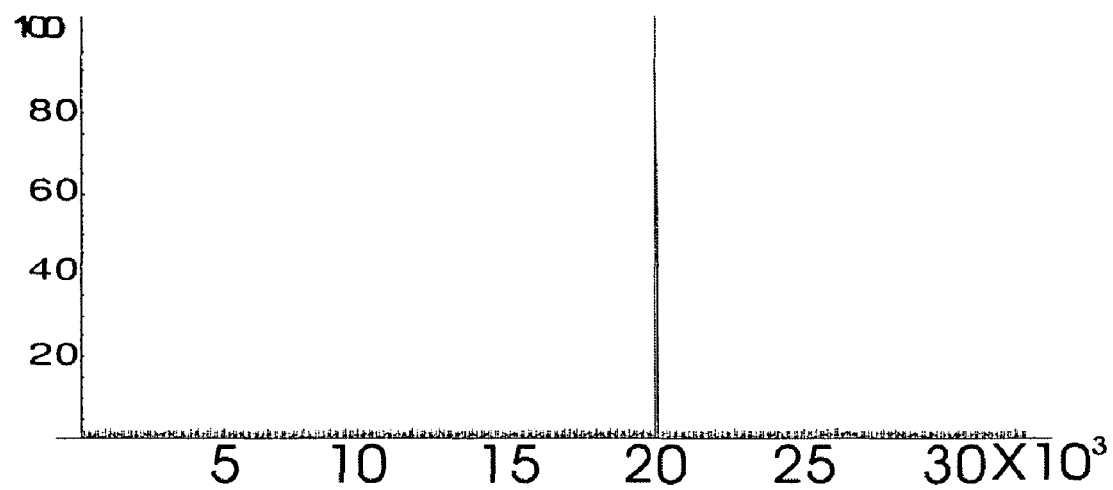
FIG. 1008

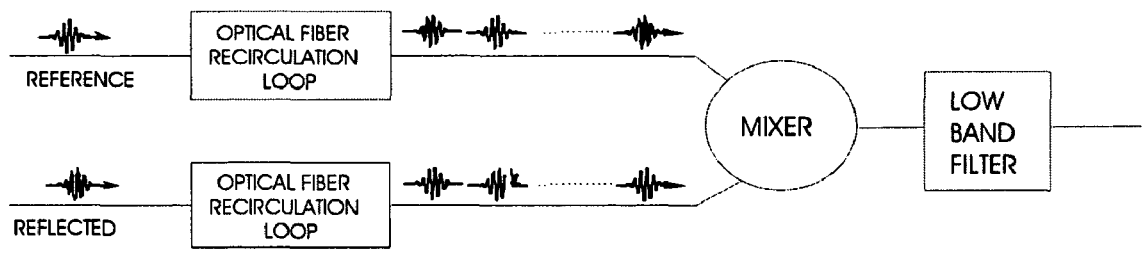
FIG. 2002
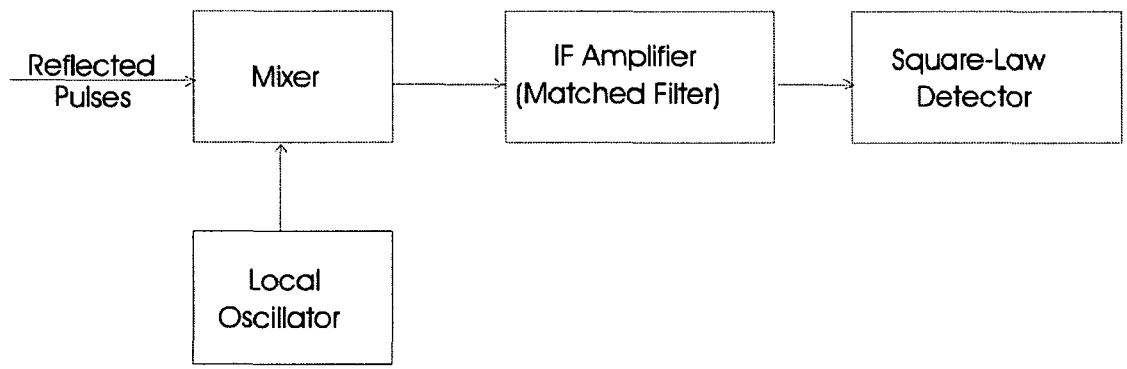
FIG. 2003

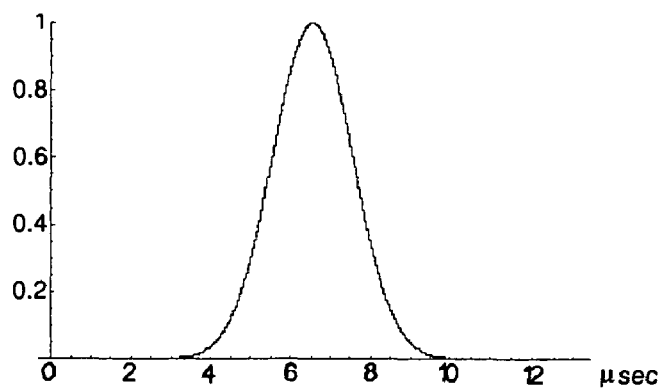
FIG. 2004
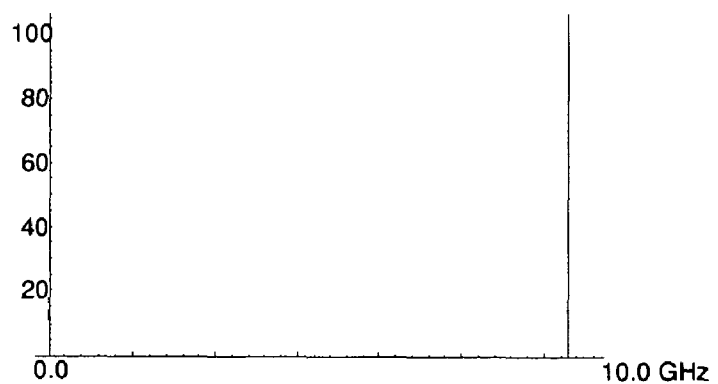
FIG. 2005
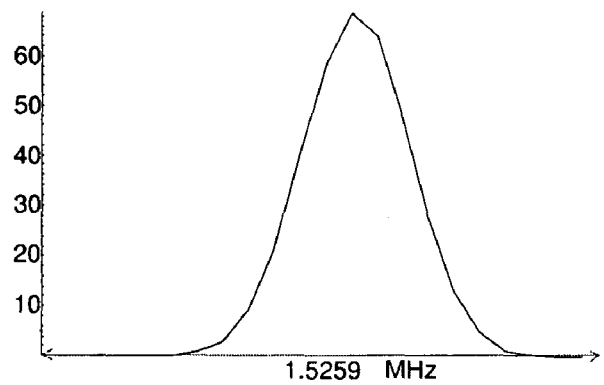
FIG. 2006

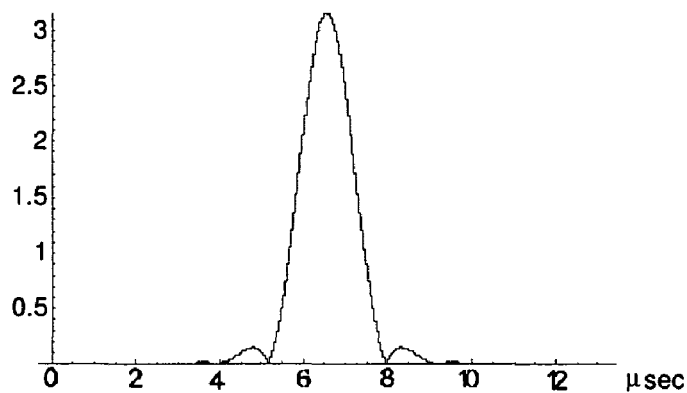
FIG. 2007
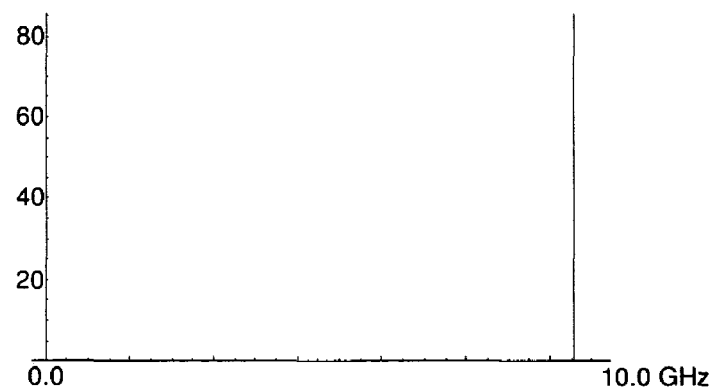
FIG. 2008
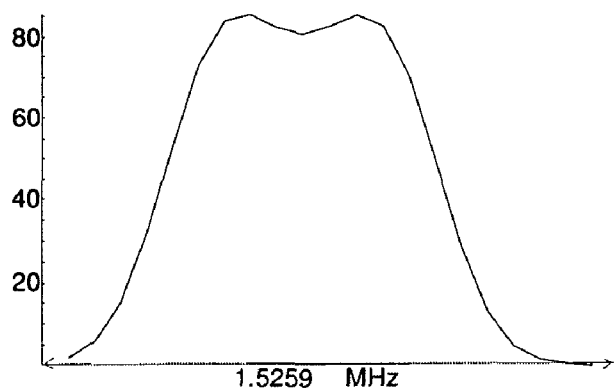
FIG. 2009

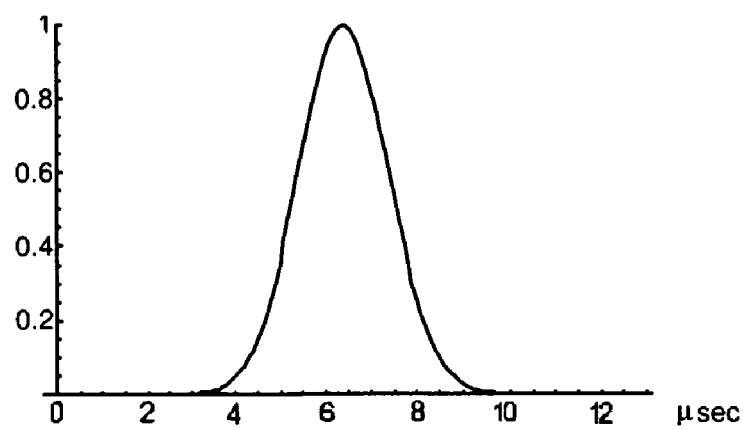
FIG. 2010
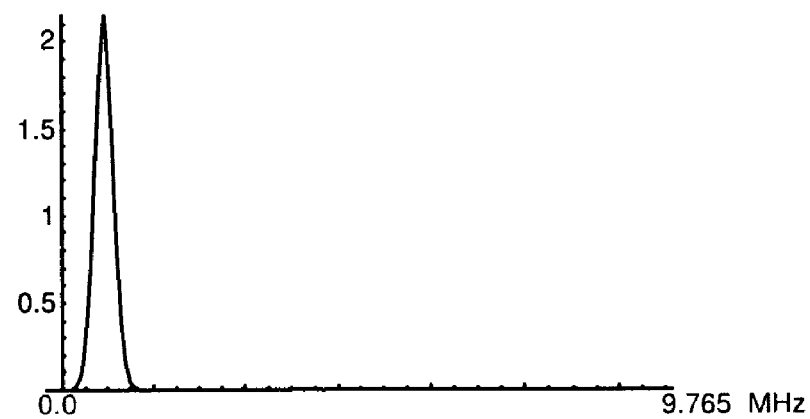
FIG. 2011
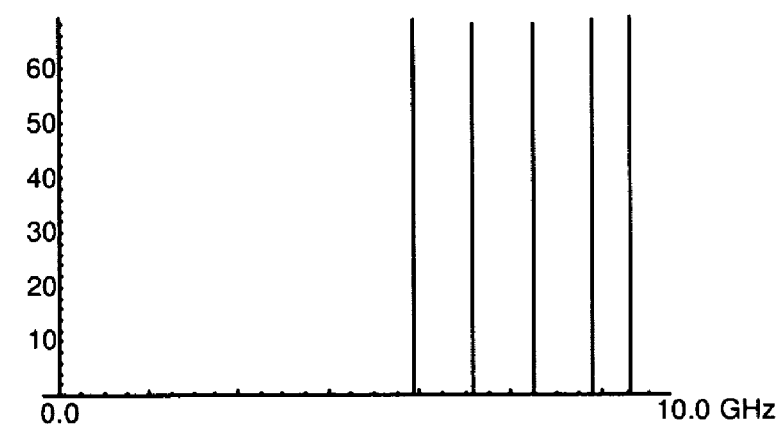
FIG. 2012

ROBUST AND BROADBAND SIGNAL PROCESSING USING REPLICA GENERATION APPARATUS

This patent application is from provisional patent application

Title:
Robust and Broadband Signal Processing using Replica Generation Apparatus Application No. 60/614,046
Filing Date Sep. 30, 2004
Applicant: Ming-Chiang Li. Mitchellville, Md.
County Code and Number of Priority Application: US60/614,046
Small Entity

TECHNICAL FIELD OF INVENTION

The present invention relates to low cost, robust, broadband, optimum, high precision methods and apparatus for processing of pulsed, transient, non-cooperative, non-reproducible, complex, or simultaneous signals based on correlation measurements utilizing optical RF signal train generators.

BACKGROUND OF INVENTION

The art on the optical methods of processing radar (RF) signals appears in these patents: U.S. Pat. No. 5,296,860 and RE. 36,944 of "Optical Fiber Based Bistatic Radar"; U.S. Pat. No. 5,294,930 and RE. 35,553 of "Optical RF Stereo"; and U.S. Pat. No. 5,955,983 "Optical Fiber Based Radars". It is known to those of ordinary skill in the art that best methods in radar signal processing are to use a radar (RF) signal as reference to process other radar signals. These patents lead to the realization of the best methods. However, the art of these patents relies on coherent RF receivers, which are conventional radar receivers.

The art on the signal processing of a single pulsed or transient signal appears in these patents: U.S. Pat. No. 5,589,929 and RE. 37,561 of "RF Signal Train Generator and Interferoceivers"; U.S. Pat. No. 6,001,506 of "Different Models for RF Signal Train Generators and Interferoceivers". A single pulsed or transient signal is short, and its contained information could not be completely captured prior to the above inventions. With the advent of RF signal train generator, which is able to store the short signal and regenerates its replicas for the purpose of repeated analyses, a new door opens to capture the complete information. The apparatus in these patents have been referred to as interferoceivers. However, the art of these interferoceivers relies on conventional RF receivers, which are well known to those of ordinary skill in the art. Interferoceivers can be incorporated with the art of the above optical methods of processing radar (RF) signals to improve their performance.

A simultaneous signal is a transient, non-cooperative, and complex radio frequency (RF) signal from various sources. It comprises multiple components over a wide range of frequencies. Conventional RF receivers in interferoceivers of prior art cannot capture complete information contained in a simultaneous signal. Hence, there is a need in the art for new interferoceivers to have the capabilities of capturing complete information contained in a simultaneous signal, and of deciphering its complexity.

Channelized receivers are well known in the prior art to analyze various simultaneous signals and to identify their complexities. These receivers are important and indispensable tools in intelligence gathering of electronic warfare to defeat hostile military operations. Such receivers are able to identify individual components in simultaneous signals. The frequency bandwidth of interest for simultaneous signals could be over 20 GHz. A prior art channelized receiver includes numerous local oscillators, and large number of narrow-band and contiguous filters.

It is difficult to fabricate the narrow-band filters in high frequencies. Simultaneous signals are down converted to a number of intermediate frequency (IF) bands with the help of local oscillators. Signal components are then classified according to IF bands. Components in each IF band are sorted out by narrow band filters. Leading and trailing edges of these components contain high frequency elements. Down conversion will filter out their high frequency elements and modify their characteristics. Although channelized receivers are able to determine frequencies, the characteristic properties of components in simultaneous signals are lost. This is a problem of the channelized receivers.

Due to the large number of filters and local oscillators, the prior art channelized receivers are expensive to fabricate, bulky in size, and difficult to maintain. The advancement of microchip based receivers and surface acoustical wave filters has eased some problems associated with fabrication and size. But it is still not able to overcome the problems of the large number of narrow-band filters, and the difficulty in configuring them. This is another problem for the channelized receivers.

The narrow-band filters operate in parallel. The incoming simultaneous signals have to be distributed into these filters. The distribution reduces the signal strength received by each individual filter. A large number of amplifiers must be installed to amplify the signal strength before distribution. This is not only expensive but also increases the noise and alters the characteristic properties of signal components. Channelized receivers could not overcome such degradation problems. This is a further problem for the channelized receivers.

In the prior art, the Bragg cell receiver can perform as a channelized receiver without hundreds of filters. The attractive feature of such a receiver is its potentially small size and low cost. Although its feasibility has been demonstrated, research and development are still needed to realize its full capability. The problems on the channelized receivers still remain the same.

Radar warning receivers are other wide band receivers in the prior art and closely related to channelized receivers. The objective of these receivers is on threat response and only searches radar signals in limited bands. Channelized receivers are for the reconnaissance and search signals in all RF bands. The division between these two types of receivers is due to the problems that channelized receivers are bulky, high cost, and not responsive. Otherwise, channelized receivers could be good electronic warfare receivers as well.

Spectrum analyzers are also well known in the prior art. The objective of these analyzers is very similar to that of channelized receivers in investigating simultaneous RF signals over a wide range of frequencies and to identify their characteristics. A typical spectrum analyzer includes a single super heterodyne receiver with a tunable oscillator to process the components in simultaneous signals. During its operations, the oscillator tunes through its range bands.

The difference between a spectrum analyzer and a channelized receiver is in their mode of operation. A spectrum analyzer operates in time sequence according to oscillator tuning steps. The simultaneous signals have to be cooperative and constantly available during the course of tuning steps. Such a requirement might be too demanding. Furthermore, the operation is time consuming. A channelized receiver operates instantaneously based on parallel processing of a large number of local oscillators, narrow band filters, and amplifiers. The difference in the mode of operation makes a spectrum analyzer much lower in cost than a channelized receiver.

Spectrum analyzers are good instruments in analyzing cooperative and continuously available signals, and can be found in most laboratories. Channelized receivers are specially designed apparatus and custom tailored to satisfy the needs of their users. Due to the sequential operation, the spectrum analyzer is not effective when signals are pulsed, simultaneous, and non-cooperative. The problem is that a spectrum analyzer could not function as a channelized receiver.

Sampling oscilloscope is another instrument known in the prior art. It uses an extremely fast sampler to sample transient signals, and can be found in most laboratories. Sampling oscilloscope is a good instrument in analyzing transient signals, which are short in pulse lengths, cooperative and easily reproducible. However, it is not effective when used as a channelized receiver, as the simultaneous signals are non-cooperative and irreproducible. In light of the above, the need in the art to have a low cost channelized receiver is not diminished with the existence of spectrum analyzers and sampling oscilloscopes.

RF receivers in interferoceivers of prior art are conventional radar receivers and RF digitizers. The former are super heterodyne receivers, which were originally invented for radio. A first requirement in super heterodyne receivers is the RF to IF down conversion with the help of local oscillators. Radar and radio signals are different. The former is pulsed and the latter continuous. Down conversion will not alter information contained in radio signals, but will drastically alter radar signals.

Leading and trailing edges of a radar signal contain rich higher frequency components. IF bandwidth is narrow and the local oscillator is not perfectly stable. After down conversion, high frequency components will be wiped out and the local oscillator injects more noises. Furthermore, down conversion introduces an arbitrary phase into the radar signal and can affect its coherence. These problems do not exist in the down conversion of radio signals.

Radar signals contain many intrinsic features, which may be unintended modulations of transmitters or intended modulations which are directly embedded. Hence real radar signals are not simple. Conventional radar receivers rely on matched filters at IF band in mimicking these features to achieve optimum detection of radar signals from targets. These filters might be able to mimic intended modulations, but they are incapable of mimicking unintended modulations and edge characteristics. Hence conventional radar receivers cannot lead to optimum detection of radar signals with the help of matched filters.

The task for detection of non-cooperative or simultaneous signals would be more difficult, as conventional RF receivers do not have a priori knowledge on their intrinsic features. Hence conventional RF receivers cannot lead to optimum detection of simultaneous signals.

RF digitizers have slow sampling rates and narrow sampling gates to digitize signals at RF level. From the digitizing principle of sample and hold, a RF digitizer has basic elements of a switch and a capacitor. During its operation and under the synchronization with the RF signal of interest, a gate pulse controls on and off of the switch and sets the location of the signal for the capacitor to be charged. The charge is then read as digitizing bits of the signal being sampled at the location. The sampling gate of a RF digitizer is determined by the width of the gate pulse, which in turn defines its frequency response. A short sampling gate leads to the low charge and low digitizing bits. This is a problem of RF digitizers.

Sampling oscilloscopes are based on RF digitizers. The above problem is also the problem for sampling oscilloscopes. In light of the above, the need in the art to improve sampling oscilloscopes is enhanced.

The deficiencies in conventional radar receivers and RF digitizers cause interferoceivers of prior art to be ineffective in most optimum, broadband, robust, and high precision detection of pulsed, transient, non-cooperative, complex, or simultaneous signals. These deficiencies are problems for interferoceivers of prior art.

In light of the above, we summarize that there is a need in the art for low cost, broadband, optimum, robust, high precision methods and apparatus of processing pulsed, transient, non-cooperative, non-reproducible, complex, or simultaneous signals to overcome above identified problems in interferoceivers of prior art, channelized receivers, electronic warfare receivers, spectrum analyzers, and sampling oscilloscopes.

Teaching of the Invention

The present invention is from the provisional patent application of "Robust and Broadband signal processing using Replica Generation Apparatus", Application No. 60/614,046. Its teaching is from these three articles: Ming-Chiang Li, "A High Precision Doppler Radar Based on Optical Fiber Delay Loops" (*IEEE Transactions on Antennas and Propagation,* 2004, 52, pp. 3319-3328); Ming-Chiang Li, "New Channelized Receivers" (Transactions of the AOC, 2004, 1, pp. 76-97); and Ming-Chiang Li, "Radar Receivers Based on Correlation Measurements" (unpublished). Hence these articles are incorporated by reference herein.

SUMMARY OF THE INVENTION

Advantageously, embodiments of the present invention are methods and apparatus that solve the problems listed above in the art and provide low cost, robust, broadband, optimum, high precision methods and apparatus of processing pulsed, transient, non-cooperative, complex, or simultaneous signals. The objective in citing a summary here is for illustration only. It is not intended to be exhaustive or to limit the teaching.

In particular, an embodiment of the present invention is an apparatus for processing pulsed, transient, non-cooperative, non-reproducible, complex, or simultaneous signals which comprises:

(a) a signal receiving apparatus which receives one or more signals, and outputs the signals, which are from known or unknown sources and have frequency widths from less than 0.10 MHz to 40 GHz or more, pulse lengths ranging from less than ten picoseconds to several microseconds or more;

(b) a replica generation apparatus, which comprises one or more RF signal train generators, accepts signals from the receiving apparatus as inputs, and outputs trains of replica pairs, where relative separations between two members in the replica pairs are same or different; and (c) an integration apparatus which performs Doppler, self, or mutual (cross) correlation operations on the replica pairs. An important aspect of the present invention is that steps of heterodyne mixing as appeared in super heterodyne receivers do not exist between the signal receiving apparatus and the integration apparatus. The integration apparatus performs correlation operations at RF or optical level on the replica pairs of received signals from the signal receiving apparatus. As those of ordinary skill in the art would appreciate that the deficiencies of super heterodyne receivers do not appear in the art of the present invention.

In another embodiment of present invention, (d) the apparatus wherein further comprises a Fourier processor that Fourier analyzes outputs from the integration apparatus and determines Doppler shifts, frequencies, pulse widths, component distributions, or interferences. As those of ordinary skill in the art would appreciate that a number of radar receivers, channelized receivers, spectrum analyzers, and interferoceivers of prior art are needed in order to achieve above determinations.

In another further embodiment of present invention, wherein the apparatus further comprises one or more reproducible signal sources, which synchronize with the replica generation apparatus, repeatedly reproduce identical pulse signals to pair and align with replicas from the replica generation apparatus, and output signal-replica pairs to the integration apparatus; the integration apparatus performs mutual correlation operations on the signal-replica pairs. Reproduced identical pulse signals are known signals. As it will be discussed later, the above mutual correlation operations open a new dimension in RF measurements.

BRIEF DESCRIPTION OF THE FIGURE

A complete understanding of the present invention may be gained by considering the following detailed description in connection with the accompanying drawings, in which:

FIG. 1001 is FIG. 1 in Ref.(1) and Ref. (2).
FIG. 1002 is FIG. 2 in Ref.(1).
FIG. 1003 is FIG. 3 in Ref.(1).
FIG. 1004 is FIG. 4 in Ref.(1).
FIG. 1005 is FIG. 5 in Ref.(1).
FIG. 1006 is FIG. 6 in Ref.(1).
FIG. 1007 is FIG. 7 in Ref.(1).
FIG. 1008 is FIG. 8 in Ref.(1).
FIG. 2002 is FIG. 2 in Ref.(2).
FIG. 2003 is FIG. 3 in Ref.(2).
FIG. 2004 is FIG. 4 in Ref.(2).
FIG. 2005 is FIG. 5 in Ref.(2).
FIG. 2006 is FIG. 6 in Ref.(2).
FIG. 2007 is FIG. 7 in Ref.(2).
FIG. 2008 is FIG. 8 in Ref.(2).
FIG. 2009 is FIG. 9 in Ref.(2).
FIG. 2010 is FIG. 10 in Ref.(2).
FIG. 2011 is FIG. 11 in Ref.(2).
FIG. 2012 is FIG. 12 in Ref.(2).

DETAILED DESCRIPTION

The following is a description of an embodiment of the present invention, which provides a broad overview of the present invention.

Figure 1:
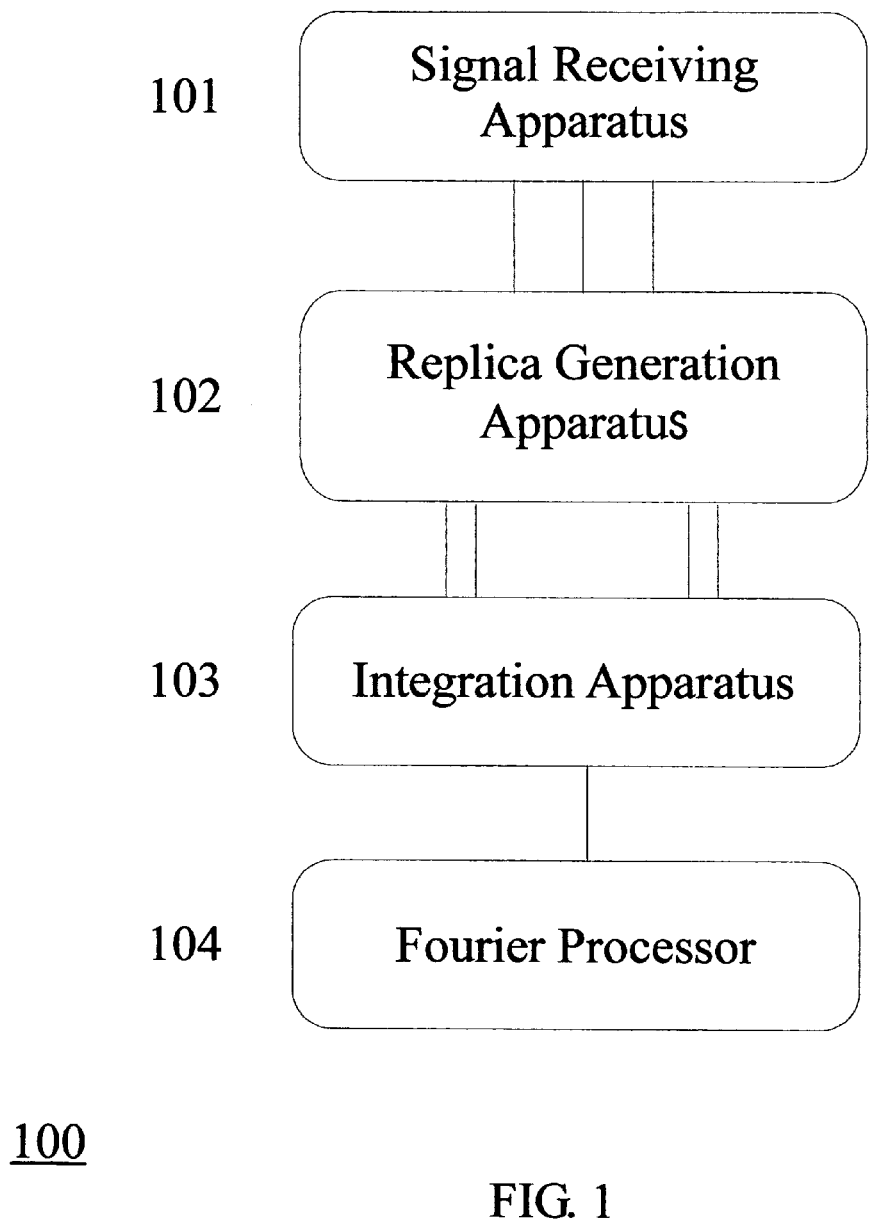
FIG. 1 shows a block diagram of an apparatus for processing pulsed, transient, non-cooperative, non-reproducible, complex, or simultaneous signals in accordance with the present invention.

FIG. 1 shows a block diagram of apparatus 100 for processing pulsed, transient, non-cooperative, non-reproducible, complex, or simultaneous signals in accordance with the present invention. As shown in FIG. 1, apparatus 100 includes the signal receiving apparatus 101, which receives pulsed, transient, non-cooperative, non-reproducible, complex, or simultaneous signals for investigation, and outputs the received signals to replica generation apparatus 102 which outputs trains of replica pairs. After receiving inputs, the integration apparatus 103 performs Doppler, self, or mutual (cross) correlation operations on the replica pairs at RF or optical level. Fourier processor 104 processes outputs from integration apparatus 103 and determines Doppler shifts, frequencies, pulse widths, component distributions, interferences, or other intrinsic features.

The block diagram of FIG. 1 denotes a general description of the present invention to achieve various interests and objectives, which may occur regarding pulsed, transient, non-cooperative, non-reproducible, complex, or simultaneous signals. Fourier processor 104 is needed to meet these interests and objectives. Anyone of ordinary skill in the art would appreciate that Fourier processor 104 may not be necessary when the interests and objectives are limited.

Figure 2:
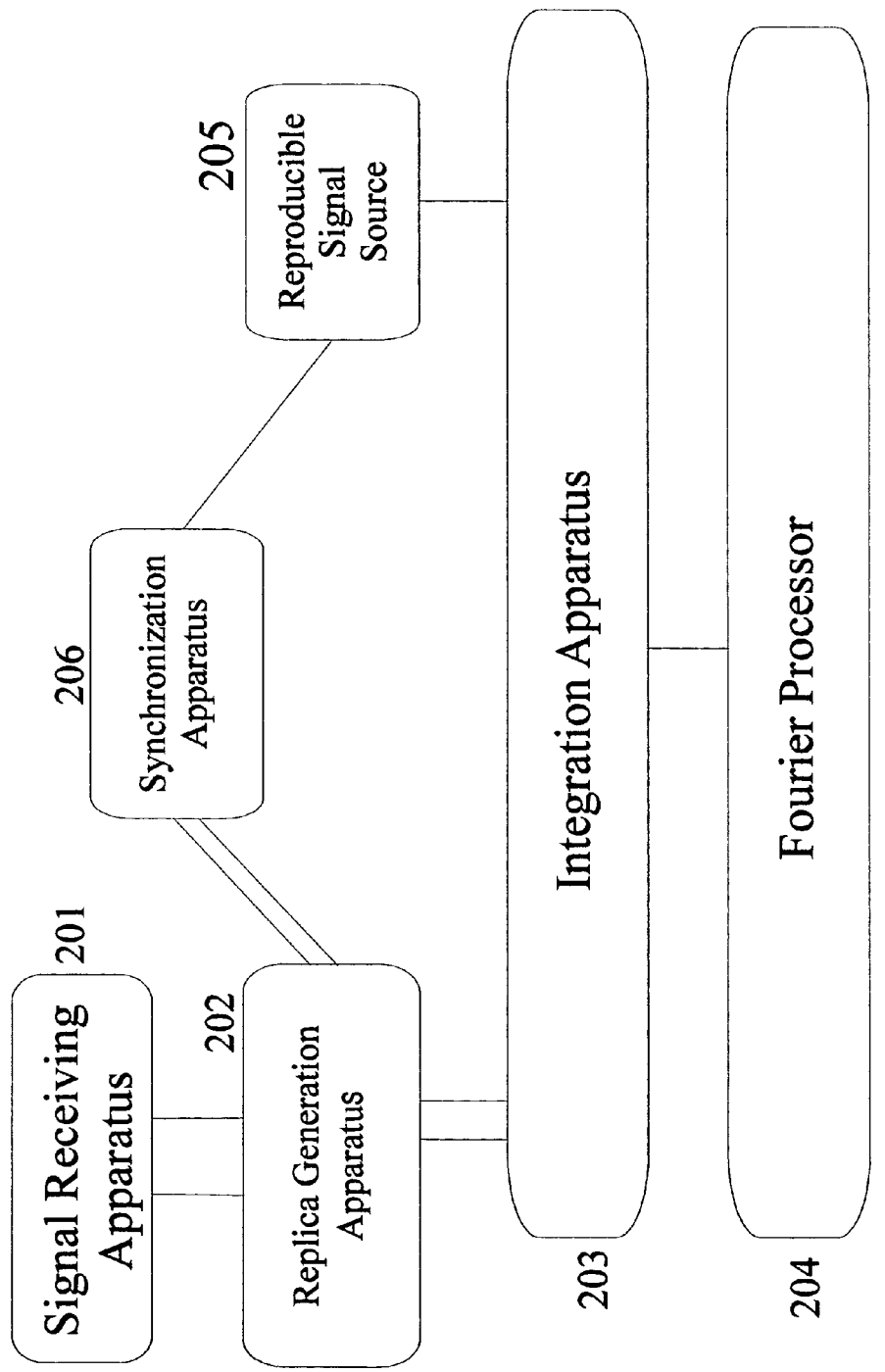
FIG. 2 shows a block diagram of an apparatus for processing pulsed, transient, non-cooperative, non-reproducible, complex, or simultaneous signals with the help of a reproducible signal source in accordance with the present invention.

FIG. 2 shows a block diagram of apparatus 200 for processing pulsed, transient, non-cooperative, non-reproducible, complex, or simultaneous signals in accordance with the present invention. As shown in FIG. 2, apparatus 200 includes signal receiving apparatus 201, which receives pulsed, transient, non-cooperative, non-reproducible, complex, or simultaneous signals for investigation, and outputs the received signals to the replica generation apparatus 202 which outputs trains of replicas. Apparatus 200 further includes reproducible signal source 205 and synchronization apparatus 206. Reproducible signal source 205 repeatedly reproduces a train of identical pulse signals. Synchronization apparatus synchronizes reproducible signal source 205 with replica generation apparatus 202 to pair and align reproduced pulse signals with replicas to form trains of signal-replica pairs. After receiving inputs from replica generation apparatus 202 and reproducible signal source 205, integration apparatus 203 performs mutual correlation operations on the signal-replica pairs at RF or optical level. Fourier processor 204 processes outputs from integration apparatus 203, and determines frequencies of received signals and/or intrinsic features as signals from reproducible signal source 205.

As those of ordinary skill in the art would appreciate that different ways of fabricating appropriate synchronization apparatus are possible. Thus, whenever the term synchronization apparatus is used herein, it is meant to be used in a most general and inclusive sense.

The block diagram of FIG. 2 denotes another general description of the present invention to achieve various interests and objectives, which may occur regarding pulsed, transient, non-cooperative, non-reproducible, complex, or simultaneous signals. Fourier processor 204 is needed to meet these interests and objectives. Anyone of ordinary skill in the art would appreciate that Fourier processor 204 might not be necessary, when the interests and objectives are limited.

Figure 21:
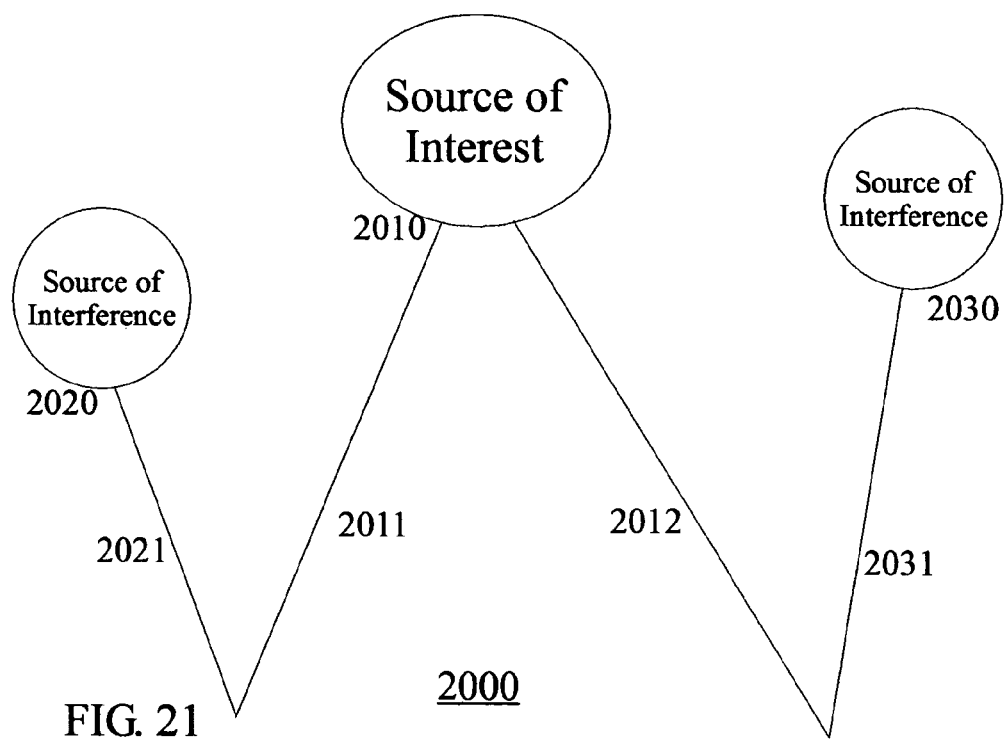
FIG. 21 shows a signal source apparatus along with sources of interference for use in fabricating embodiments of the present invention.

FIG. 21 shows, in pictorial form, a signal source apparatus 2000 for use in fabricating embodiments of the present invention. As shown in FIG. 21, signals from source of interest 2010 through paths 2011 and 2012 input to the signal receiving apparatus. These signals may be contaminated by signals from source of interference 2020 through signal path 2021 and by signals from source of interference 2030 through signal path 2031 respectively. Furthermore, a signal or signals from source of interest 2010 may be simultaneous signals. Thus whenever the term of a signal or signals from source of interest is used herein, it is meant to be used in a most general and inclusive sense.

FIG. 21 represents stereo receiving as in optical RF stereo and interferoceivers of prior art. The operation of optical RF stereo and interferoceivers of prior art requires that the frequency on source of interest 2010 has to be known in order to reveal its characteristics. If the frequency is not known, than a channelized receiver has to be employed in identifying the frequency. In the presence of contaminations, the frequency identification will become difficult. Many trials, along with the help of other means, are needed for the channelized receiver to identify the frequency. Furthermore, if source of interest 2010 is unstable or frequency hops, than it has no precise frequency. Optical RF stereo and interferoceivers of prior art will degrade their performance. The revealed characteristics on source of interest 2010 become blurry.

Above problems do not appear in apparatus of the present invention, as explained in the three articles: "*Radar Receivers Based on Correlation Measurements*", "A High Precision Doppler Radar Based on Optical Fiber Delay Loops", and "New Channelized Receivers". It is due to the integration apparatus of the present invention. Source of interest 2010 need not be known, and will be automatically identified along with contaminations.

Signal paths 2011, 2012, 2021, 2031 or others that will be referred to later could be free air, coaxial cables, wave guides, micro strips, optical RF link systems, or . . . and along with various amplifiers, antennas, lenses, connectors, terminals, ports, converters . . . . Many different ways of fabricating appropriate signal paths are well known to those of ordinary skill in the art. Thus, whenever the term signal path is used herein, it is meant to be in a most general and inclusive sense.

As described in the art of optical RF stereo for sending signals through optical RF link systems, these signals are up converted to optical RF signals at one end, then transit through optical fiber or free laser to the other end for down conversion back to these signals again. Similar conversions are also presented in optical RF recirculation loops. Optical RF link systems and optical RF recirculation loops are well known art. Optical RF up and down conversions will be implicitly applied herein.

Figure 22:
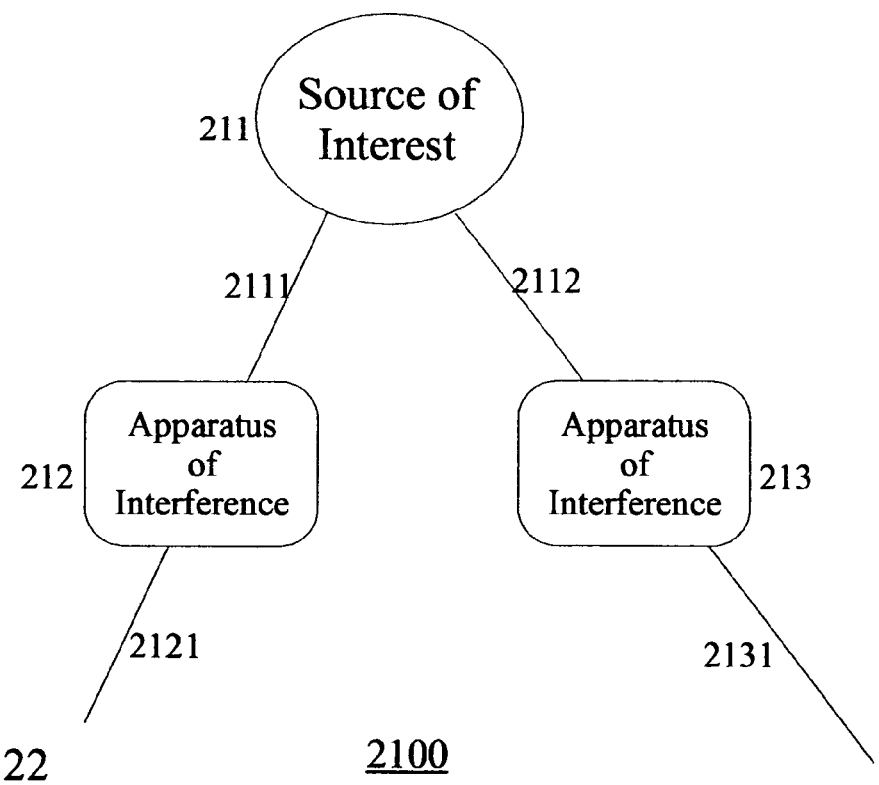
FIG. 22 shows another source apparatus along with apparatus of interference for use in fabricating embodiments of the present invention.

FIG. 22 shows, in pictorial form, another source apparatus 2100 for use in fabricating embodiments of the present invention. As shown in FIG. 22, signals from source of interest 211 through paths 2111 and 2112 input to the signal receiving apparatus. These signals may pass through apparatus of interference 212 and 213 respectively that lead to their contaminations and alter their paths to paths 2121 and 2131. A configuration as FIG. 22 is often encountered in the long base line radio interferometer. Source of interest 211 is a remote star, and apparatus of interference are atmosphere. The performance of ground based radio interferometers is contaminated by atmospheric disturbance. Apparatus of the present invention are superior in comparing with others in existence to minimize these contaminations on the source of interest as well as investigating the disturbance.

A configuration as FIG. 22 also represents stereo receiving and is very similar to FIG. 21. The difference between these two is the mode of contamination. The former is passive and the latter active. Source of interest 211 is an unknown radar source, but is not in line of sight. Apparatus of interference 212 and 213 are targets, which are interrogated by source of interest 211. Physical sizes of radar targets are usually less than the length of radar pulses. An apparatus of the present invention will lead to the determination on intrinsic properties of the source 211, and on whether these two targets are interrogated by one or two separated radars. Furthermore, configuration as FIG. 2 can be applied to many other cases, and is to be understood as a general configuration.

Figure 23:
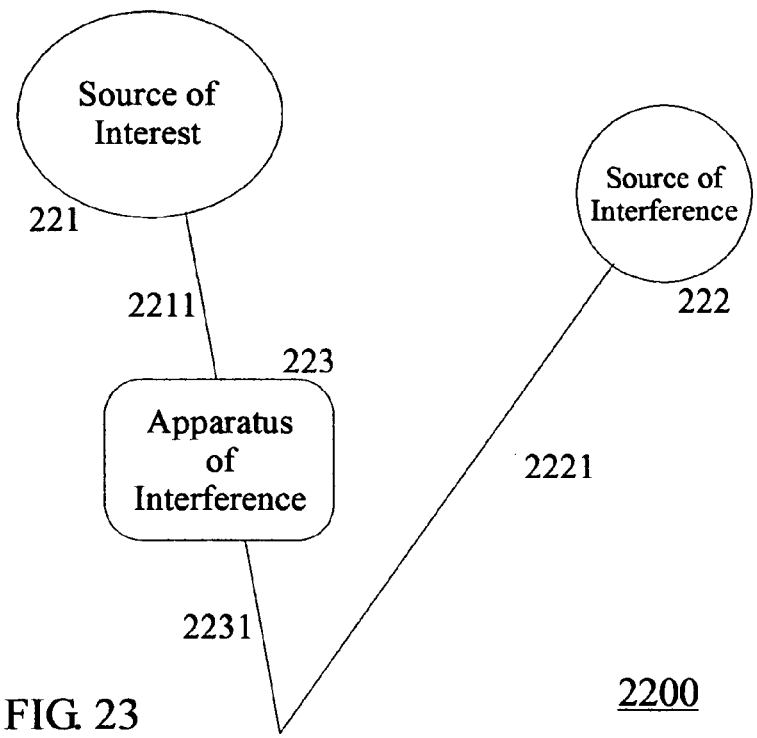
FIG. 23 shows another further source apparatus along with a source and apparatus of interference for use in fabricating embodiments of the present invention.

FIG. 23 shows, in pictorial form, further signal source apparatus 2200 for use in fabricating embodiments of the present invention. As shown in FIG. 23, signals from source of interest 221 through path 2211 input to the signal receiving apparatus. These signals might be contaminated by apparatus of interference 223 and altered to path 2231. Furthermore these signals might be also contaminated by source of interference 222 through signal path 2221.

FIG. 23 represents a complex scenario. If source of interest 221 is a radar emitter, then source of interference 222 is usually a source of broad jamming. An apparatus of the present invention will distinguish signals from source of interest 221 from that of jamming, and identify the characteristics of the source 221 from self correlations. If apparatus of interference 223 moves, then, through mutual correlations between sequential signals from source of interest 221, the apparatus of the present invention will provide important features on apparatus of interference 223 and will exhibit these features as a function of time.

Figure 24:
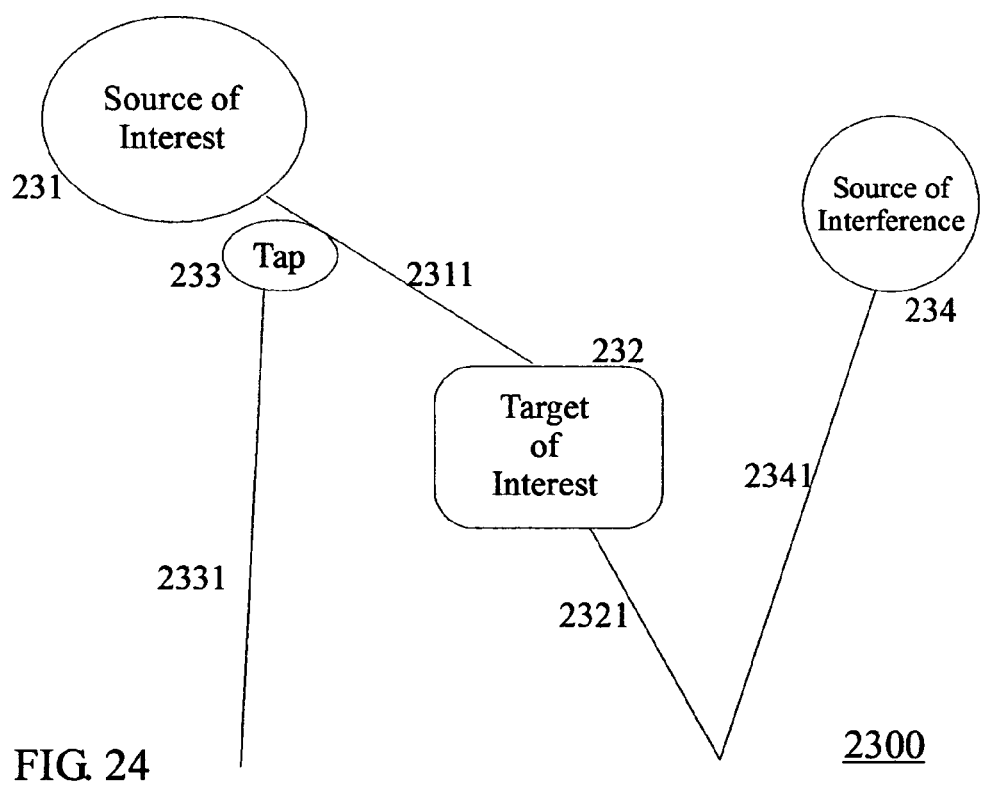
FIG. 24 shows a signal source apparatus of a radar system for use in fabricating embodiments of the present invention.

FIG. 24 shows, in pictorial form, signal source apparatus 2300 of a radar system for use in fabricating embodiments of the present invention. As shown in FIG. 24, signals from source of interest 231 through path 2311 are transmitted to target of interest 232. Reflected signals from target of interest 232 through path 2321 are received by the signal receiving apparatus. These received signals might be contaminated by signals from source of interference 234 through signal path 2341. On path 2311, tap 231 taps out a portion of each signal transmitted from radar emitter 231 to target of interest 232. Tapped out signals then through signal path 2331 are sent to the signal receiving apparatus. Signal path 2331 is well protected to exclude signals being sent from contaminations. Configuration of FIG. 24 applies to both monostatic and bistatic radars.

RF receivers in conventional monostatic radar, bistatic radar, and in interferoceivers of prior art rely on super heterodyne conversions and matched filters to suppress contaminations and to achieve optimum detection. Those of ordinary skill in the art would appreciate that present inventions have many advantages in comparison with those rely on super heterodyne conversions and matched filters. Super heterodyne receivers are narrow band receivers and whose filters can not be perfectly matched. Present art apparatus are true correlation receivers and will lead to optimum detection and better rejection of contaminations. Furthermore, present art apparatus can play both roles of radar and channelized receivers in identifying the source of interference that would lead to actions in minimizing or eliminating the source of interference. Those of ordinary skill in the art would appreciate that RF receivers in conventional radar and interferoceiver of prior art do not have such a capability in identifying the source of interference.

Radar is a special case of scattering process. The radar emitter is the scattering source. A scattering may be in various angles, which include backward reflection, forward transmission, etc. . . . The art of present invention applies to all these scatterings. Hence, whenever the terms "source and target of interest" are used herein, they are meant to be used in their most general and inclusive sense.

Target of interest 232 may have pitch, roll, or yaw motions. These motions provide the apparatus of present invention a detailed mechanism to investigate the signature of target 232. Such a mechanism is usually referred to as the Doppler cross range and leads to the silhouette image. Those of ordinary skill in the art would appreciate that silhouette images from the art of present invention will be much sharper than that from other means, and more information on the target of interest would be gained by taking its sequential silhouette images as a function of time.

Inverse synthetic aperture radar (ISAR) relies on the down (slant) range and Doppler cross range to produce two dimensional ISAR image. The down range signature of target 232 can be obtained through the transmission of radar pulses by stepping carrier frequencies. In conventional radar, the stepping is done sequentially. It takes time to step through all these frequencies. The down range resolution depends on the step size and number of steps. As the number increases, the dwell time on a target of interest also increases. The velocity of elements on the target due to pitch, roll or yaw motions changes with time. The long dwell time leads to the blurring of down range. ISAR was proposed in 1980 to image targets such as ship, aircraft, and space objects. The blurring in both down and cross ranges causes ISAR unsuitable for practical use to solve the problem of passive identification.

The art of present invention automatically removes the Doppler cross range blurring, since only a single pulse is need to measure pulsed Doppler beating. There is a mechanism in the art of present invention; it is to transmit some of pulses with different stepped frequencies simultaneously. The returned simultaneous pulses are processed through parallel replica generation and integration apparatus. The mechanism reduces the dwell time, hence the art of present invention will lead to sharp ISAR images for ship, aircraft, and space objects which are more than 100 Km away and even remote stars. With sharp ISAR images, the passive identification is no longer a problem.

Due to narrow band RF receivers, it would be difficult for the interferoceiver of prior art to process the returned simultaneous pulses with different stepped frequencies. Such a difficulty does not exist in the new interferoceiver of present invention.

In accordance of present invention, source of interest 231 may transmit simultaneous signals, and replica generation and integration apparatus may be operated in parallel. Furthermore, target of interest 232 may be a transient phenomenon to be probed. The mechanism of down range divides the phenomenon into slices. Those of ordinary skill in the art would appreciate that the apparatus of present invention leads to spatial and Doppler information on each slice. Hence, whenever the terms "source and target of interest, and replica generation and integration apparatus" are used herein, they are meant to be used in their most general and inclusive sense.

Optical microscopes are important instruments for viewing micro structures, but the structures of interest have to be stationary and placed at neighborhoods of optical focal points of these microscopes. The art of present invention is able to remove above restrictions through optical ISAR images. Just as in the microwave case, the cross range is from the Doppler beating and the down range may be from transmitted light pulses with different stepped frequencies simultaneously. Such a simultaneous light transmission is very similar to wave division multiplex in optical communication. Thus whenever the term ISAR image is used herein, it is meant to be used in a most general and inclusive sense.

Many methods exist to achieve the down range. The method of stepped frequency is one of them. Thus, whenever the term down range is used herein, it is meant to be used in a most general and inclusive sense.

Figure 25:
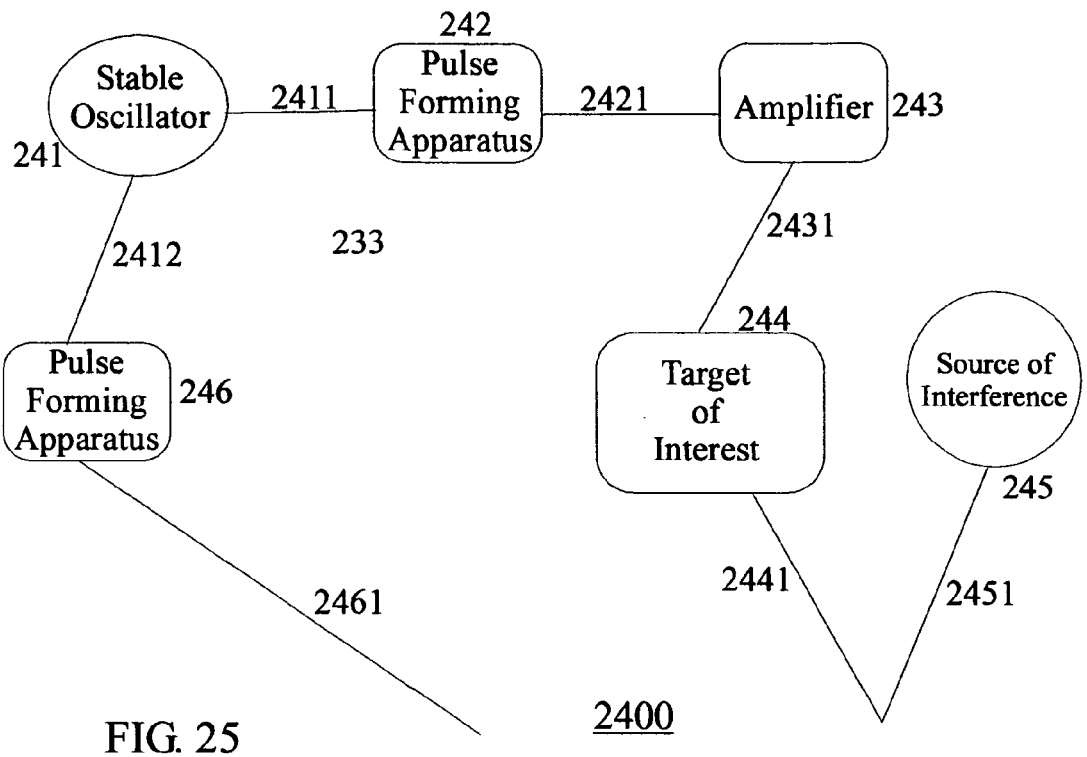
FIG. 25 shows a signal source apparatus of another radar system for use in fabricating embodiments of the present invention.

FIG. 25 shows, in pictorial form, signal source apparatus 2400 of another radar system for use in fabricating embodiments of the present invention. As shown in FIG. 25, stable oscillator 241 through signal path 2411 sends its continuous signal to pulse forming apparatus 242, which converts the continuous signal to pulsed signals and outputs signals to amplifier 243 through signal path 2421. Amplifier 243 after amplification transmits signals to target of interest 244 through signal path 2431. Reflected signals from target of interest 244 through path 2441 are received by the signal receiving apparatus. These received signals might be contaminated by signals from source of interference 245 through signal path 2451. Pulse forming network and amplifier are well known to those of ordinary skill in the art. Stable oscillator 241 also sends its continuous signal through signal path 2412 to pulse forming apparatus 246, which converts the continuous signal to pulsed signals, and outputs signals to the signal receiving apparatus through signal path 2461. Pulses from pulse forming apparatus 246 are delayed such that pulses through signal path 2461 will pair and align with signals from signal path 2441, hence members in each pair will reach the signal receiving apparatus at about the same time.

Pulsed signals converted by pulse forming apparatus 246 should be the same as that by pulse forming apparatus 242 for optimum detection on target of interest 244. However, a target modifies a radar pulse into a pulse with different characteristics. If it is known how the target modifies reflected pulses, then for most optimum detections pulse forming apparatus 246 should form the converted pulses to be the same as reflected pulses.

Sometimes target of interest 244 might be more than 100 Km away. Replicas in pairs have to be overlapped in correlation operations. An alignment is needed to achieve overlapping. As those of ordinary skill in the art would appreciate that signal alignment through pulse forming delay is easier to accomplish than those through fiber delay lines and loops with various lengths. However the use of pulse forming delay would restrict the selection of signal sources. Those of ordinary skill in the art would further appreciate that it is feasible for a single pulse forming apparatus to play both roles as in the case of pulse forming apparatus 242 and 246.

Figure 26:
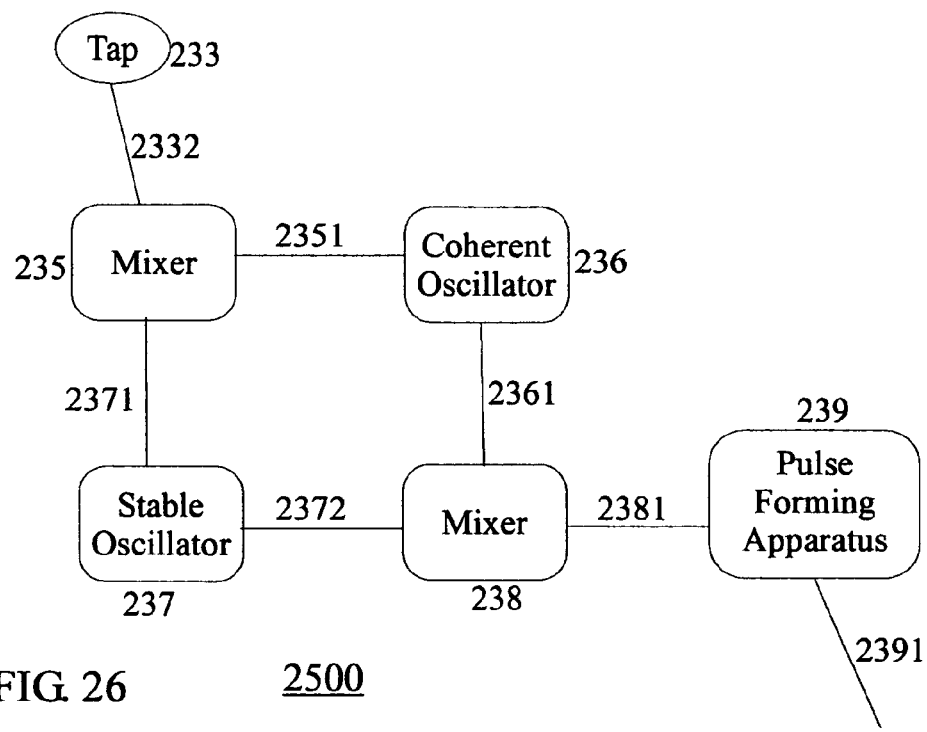
FIG. 26 shows an alignment scheme for use in fabricating embodiments of the present invention.

FIG. 26 shows, in pictorial form, an alignment scheme 2500 for use in fabricating embodiments of the present invention. As shown in FIG. 26, tap 233 from FIG. 24 applies taped signals from radar emitter 231 to mixer 235 through signal path 2332. Stable oscillator 237 generates a continuous signal and applies a portion of the generated signal to mixer 235 through signal path 2372. Mixer 235 mixes signals from signal path 2332 with that from signal path 2371, down-converts signals from signal path 2332 to lower frequency, and applies its outputs to coherent oscillator 236 through signal path 2351. Coherent oscillator 236 locks onto signals from mixer 235 on pulse to pulse basis, and outputs signals to mixer 238 through signal path 2361. Stable oscillator 237 applies another portion of the generated signal to mixer 238 through signal path 2372. Mixer 238 mixes signals from signal path 2361 with that from signal path 2372, up converts signals from coherent oscillator 236, and applies its outputs to pulse forming apparatus 239 through signal path 2381. Pulse forming apparatus 239 converts signals from mixer 238 to pulsed signals with time delays, and outputs them through signal path 2391 to the signal receiving apparatus. Time delays will cause them to pair and align with signals from signal path 2321, such that members in each pair will reach the signal receiving apparatus about the same time. Pulse forming apparatus 239 have capabilities such that its output signals are very similar to signals emitted by radar emitter 231. Coherent oscillator, which is utilized in magnetron based Doppler radar, is well known to those of ordinary skill in the art. FIG. 26 provides an alignment scheme, which is similar to that of FIG. 25.

Coherent oscillator 236, as known at present, operates in IF. As the technology advances, coherent oscillator 236 might operate in RF as well. If such technology arrives, then coherent oscillator 236 will lock on to taped signals from radar emitter 23 1directly. Stable oscillator 237, mixer 235, and mixer 238 become unnecessary.

FIG. 25 and FIG. 26 provide alternative forms of alignment. Those of ordinary skill in the art would appreciate that different ways for alignment are possible. Thus, when the term of alignment is used herein, it is meant to be used in a most general and inclusive sense.

Figure 27:
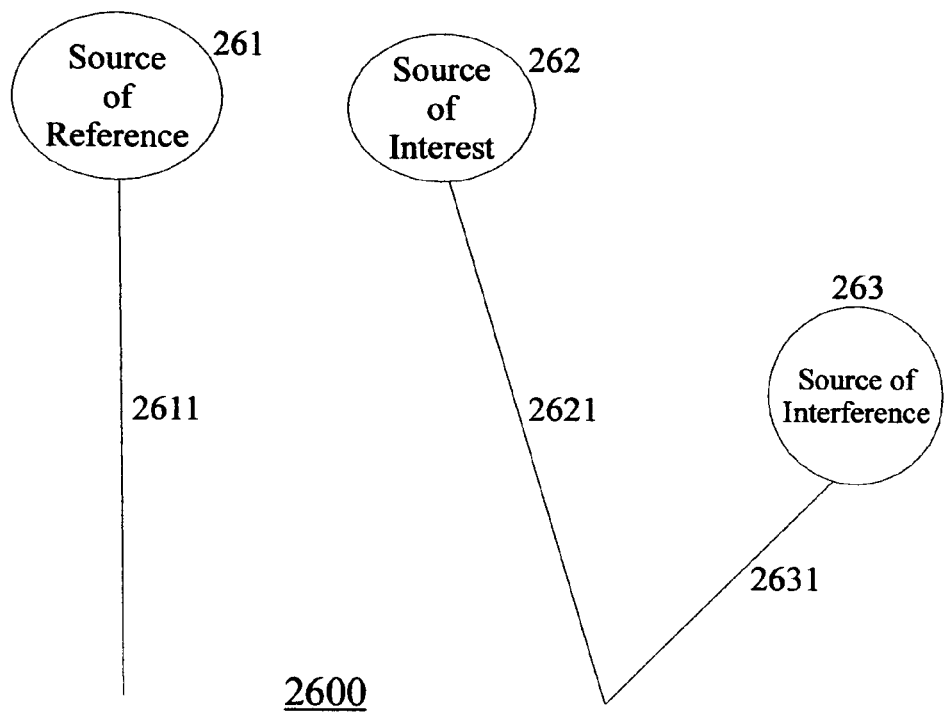
FIG. 27 shows a signal source apparatus along with a source of reference for use in fabricating embodiments of the present invention.

FIG. 27 shows, in pictorial form, signal source apparatus 2600 along with source of reference 261 for use in fabricating embodiments of the present invention. As shown in FIG. 27, source of interest 262 emits signals through signal path 2621 to the signal receiving apparatus. Source of interference 263 through signal path 2631 might contaminate these received signals. Source of reference 261 emitted well defined signals through signal path 2611 to the signal receiving apparatus and to pair and align with signals from signal path 2621. Members in every pair reach the signal receiving apparatus at about the same time. Signals emitted by source of reference 261 have a well defined frequency and band spread. Through mutual correlations, the integration apparatus and Fourier processor will determine frequency components of signals emitted by signal source of interest 262 in the frequency band as defined by source of reference 261.

Anyone with ordinary skill in the art would appreciate, embodiment 2600 of FIG. 27 provides a simple and time saving method of investigating whether signals emitted by source of interest 262 within a specific frequency band and/or intrinsic features similar to that from source of reference 261. It would take more time for the method of embodiment 2200 in FIG. 23 to process signals emitted by source of interest 221.

Figure 28:
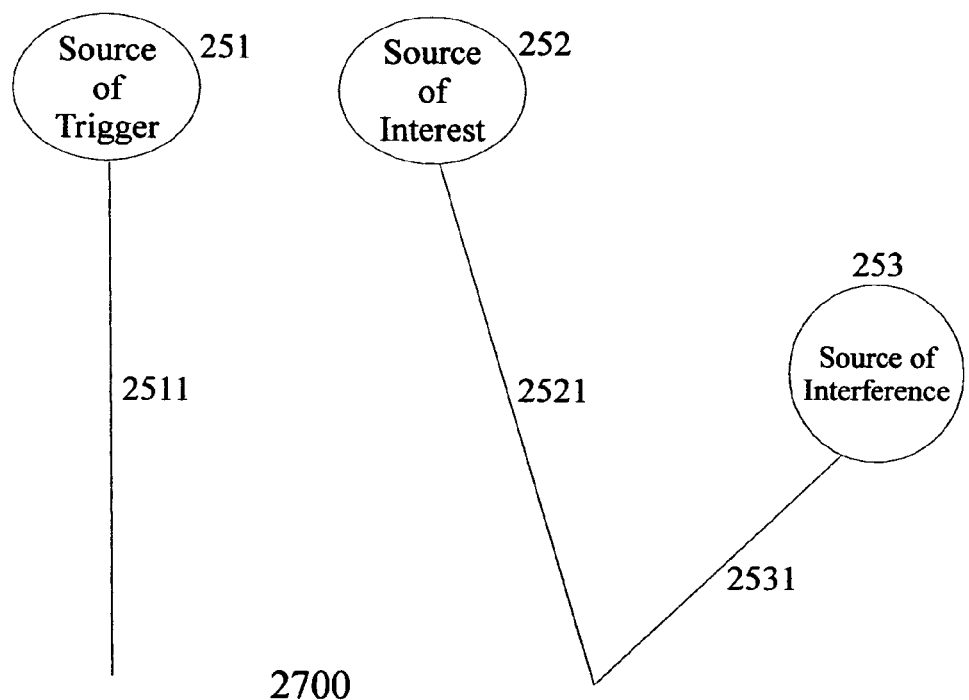
FIG. 28 shows a signal source apparatus along with a source of trigger for use in fabricating embodiments of the present invention.

FIG. 28 shows, in pictorial form, signal source apparatus 2700 along with source of trigger 251 for use in fabricating embodiments of the present invention. As shown in FIG. 28, source of interest 252 emits signals through signal path 2521 to the signal receiving apparatus. Source of interference 253 through signal path 2531 might contaminate these received signals. Source of trigger 251 emitted trigger signals through signal path 2511 to the signal receiving apparatus and to pair and align with signals from signal path 2521. Members of each pair reach the signal receiving apparatus about the same time. Signals emitted by source of trigger 251 have a well defined leading or trailing edge. The use of trigger signals will be discussed later.

Figure 29:
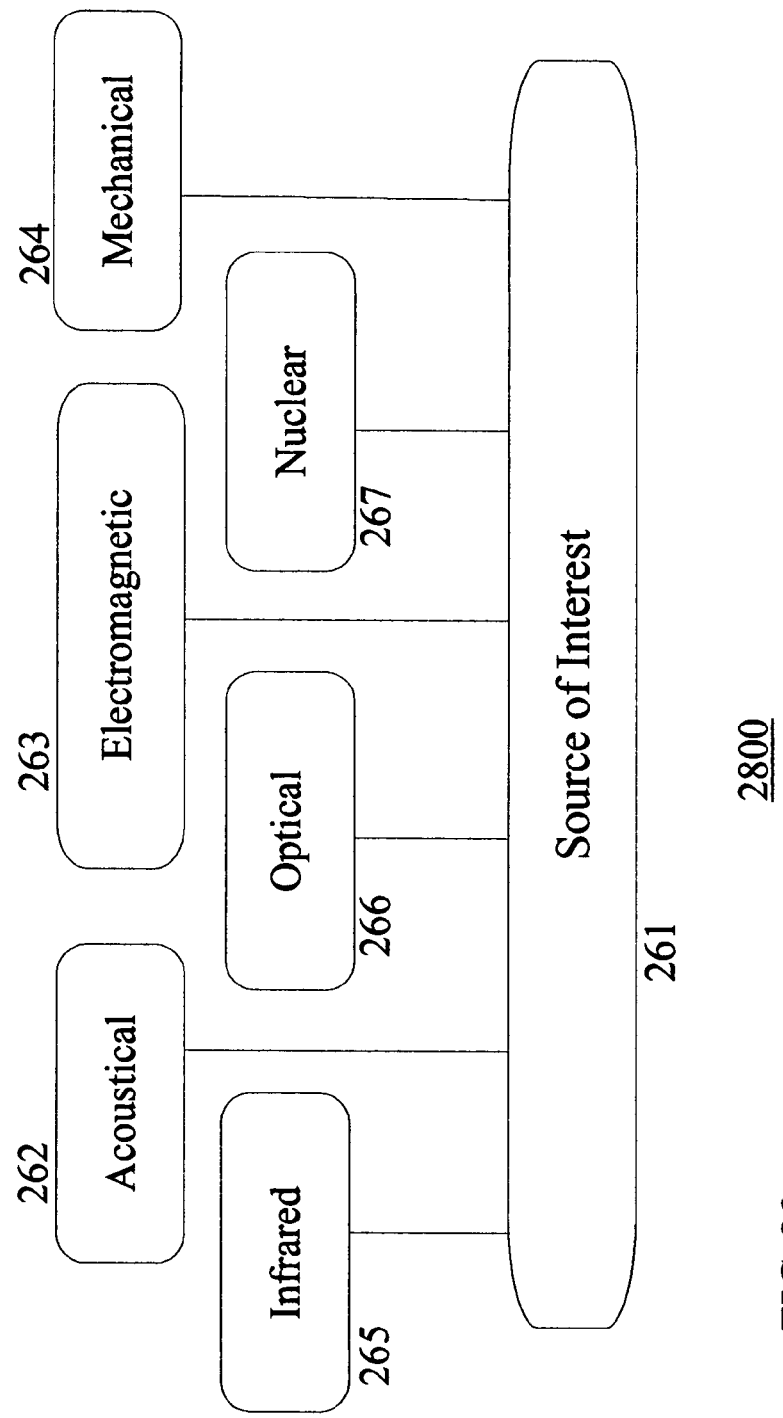
FIG. 29 shows various source apparatus for use in fabricating embodiments of the present invention.

FIG. 29 shows, in pictorial form, various source apparatus 2800 for use in fabricating embodiments of the present invention. As shown in FIG. 29, source of interest 261 might be acoustical 262, electromagnetic 263, mechanical 264, infrared 265, optical 266, or nuclear 267. Signals from the above sources may have to be converted before reaching the signal receiving apparatus. Methods of conversions are well known to those of ordinary skill in the art.

Source apparatus depicted above are only a few examples. There are others, especially, those depicted in U.S. Pat. No. 5,589,929 and RE. 37,561 E of "RF Signal Train Generator and Interferoceivers" and U.S. Pat. No. 6,001,506 of "Different Models for RF Signal Train Generators and Interferoceivers". Thus, when the term of source apparatus is used herein, it is meant to be used in a most general and inclusive sense.

Figures 31, 32, 33:
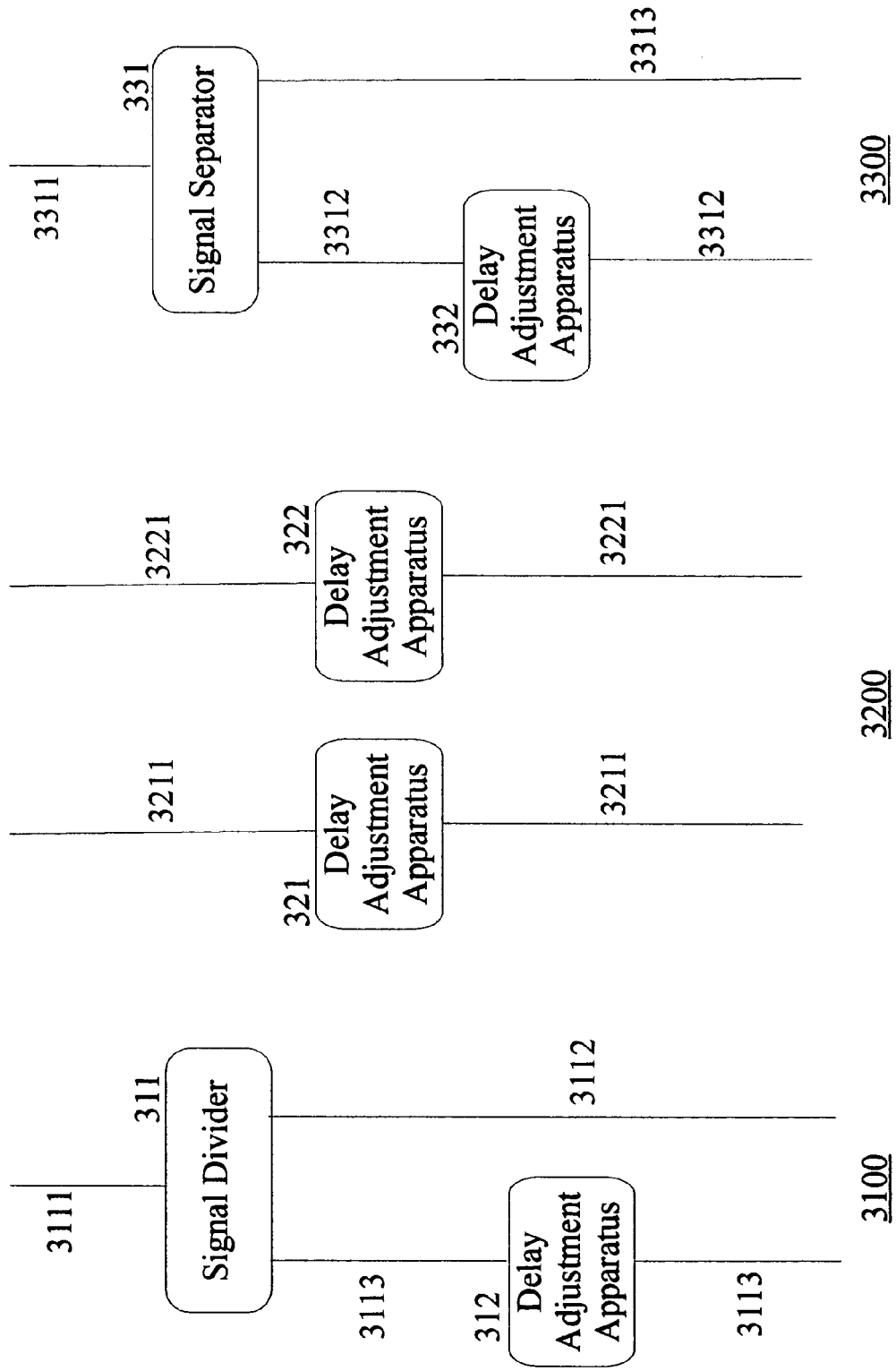
FIG. 31 shows a block diagram of the signal receiving apparatus with a signal divider for fabricating embodiments of the present invention.
FIG. 32 shows a block diagram of the signal receiving apparatus with delay adjustment apparatus for fabricating embodiments of the present invention.
FIG. 33 shows a block diagram of the signal receiving apparatus with a separator and delay adjustment apparatus for fabricating embodiments of the present invention.

FIG. 31 shows, in pictorial form, a block diagram of the signal receiving apparatus 3100 with additional components as follows, for fabricating embodiments of the present invention. As shown in FIG. 31, signal divider 311 divides (splits) a signal received from signal path 3111 into two portions, one through signal path 3112 and the other through signal path 3113 to the replica generation apparatus respectively. These two portions form a signal pair. Delay adjustment apparatus 312 on signal path 3113 alters the alignment between these two portions according to the needs in correlation operations of their replica pairs. Many ways of fabricating an appropriate delay adjustment apparatus are known to those of ordinary skill in the art. Thus, whenever the term delay adjustment is used herein, it is meant to be used in a most general and inclusive sense.

The signal receiving apparatus may be an antenna, aperture, transducer, lens, probe, opening, port, or .... Thus, when the term of signal receiving apparatus is used herein, it is meant to be used in a most general and inclusive sense.

FIG. 32 shows, in pictorial form, another block diagram of the signal receiving apparatus 3200 with additional components as follows, for fabricating embodiments of the present invention. As shown in FIG. 32, the signal receiving apparatus receives a signal from signal path 3211 and outputs it to the replica generation apparatus. Meanwhile, the signal receiving apparatus receives another signal from signal path 3221 and outputs this signal to the replica generation apparatus. These two signals form a signal pair. Delay adjustment apparatus 321 and 322 on signal paths 3211 and 3221 respectively alter the alignment between two signals according to the need in correlation operations of their replica pairs. Anyone with ordinary skill in the art would appreciate that, in some cases, only one or none of the delay adjustment apparatus is needed.

FIG. 33 shows, in pictorial form, further block diagram of the signal receiving apparatus 3300 with additional components as follows, for fabricating embodiments of the present invention. As shown in FIG. 33, the signal receiving apparatus receives two sequential signals from signal path 3311. Signal separator 331 separates these two signals, outputs first through signal path 3312 and second through signal path 3313 to the replica generation apparatus respectively. These two signals form a signal pair. Delay adjustment apparatus 332 on signal path 3312 alters the alignment between two signals according to the need in correlation operations of their replica pairs.

In accordance with the present invention, in order to achieve quadrature measurements, quadrature phase shifters are inserted into FIGS. 31-33 as needed. Ways to insert phase shifters are known to those of ordinary skill in the art. It is noted that further embodiments of the present invention comprise embodiments shown in FIGS. 31-33 with phase shifters.

In accordance with the present invention, in order to achieve various objectives of interests, signals may be from multiple paths and form pairs with a number of variations. Further embodiments of the present invention comprise multiple combinations of the embodiments shown in FIGS. 31-33 with and/or without phase shifters.

Figure 41:
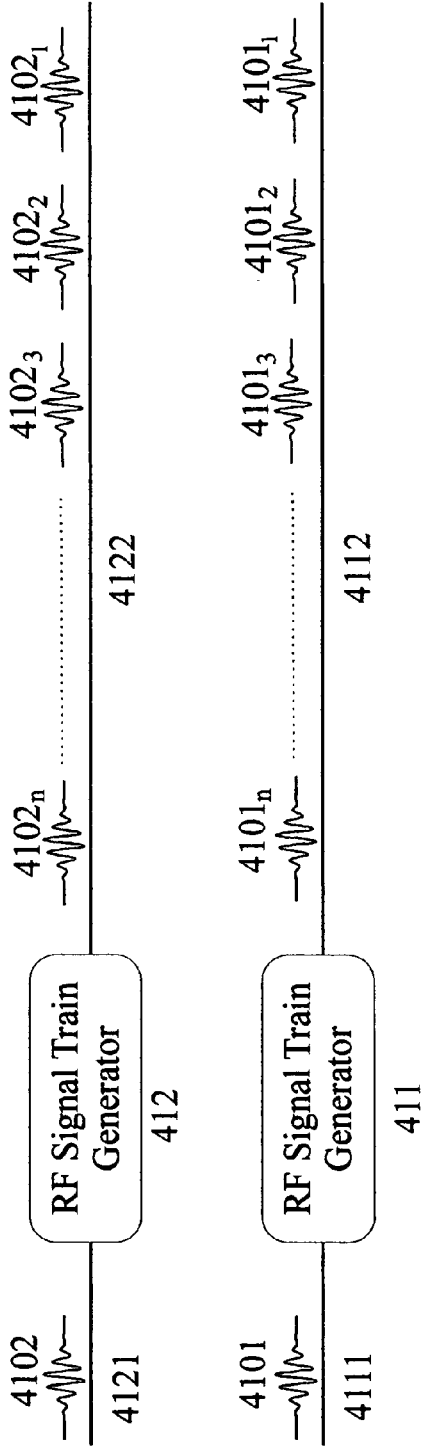
FIG. 41 shows a block diagram of the replica generation apparatus for fabricating embodiments of the present invention, where two optical fiber RF delay loops have the same loop length.

FIG. 41 shows, in pictorial form, a block diagram of the replica generation apparatus 4100, which includes RF signal generators 411 and 412, for fabricating embodiments of the present invention. As shown in FIG. 41, the replica generation apparatus takes the input of a signal pair from the signal receiving apparatus. One signal 4101 of the pair is from signal path 4111, and the other signal 4121 from signal path 4112. RF signal train generator 411 generates a train of replicas $4101_1, 4101_2, 4101_3, \ldots, 4101_n$ from signal 4101 and outputs train of replicas through signal path 4112. RF signal train generator 412 generates another train of replicas $4102_1, 4102_2, 4102_3, \ldots, 4102_n$ from signal 4102 and outputs train of replicas through signal path 4122.

RF signal train generators comprise of optical fiber RF delay loops as described in U.S. Pat. No. 5,589,929 and RE. 37,561 E of "RF Signal Train Generator and Interferoceivers", and U.S. Pat. No. 6,001,506 of "Different Models for RF Signal Train Generators and Interferoceivers". These patents are incorporated by reference herein. Optical fiber RF delay loops have names like optical fiber recirculation loops, optical fiber recirculation delay line loops, .... Furthermore, these generators and loops have many different designs. As the technology evolves, more new designs will appear. The main function for a RF signal train generator is to repeatedly produce RF replicas. Thus, whenever the terms of RF signal train generators and optical fiber RF delay loops are used herein, they are meant to be used in their most general and inclusive sense.

As shown in FIG. 41, replica $4101_1$ pairs with replica $4102_1$, replica $4101_2$ with replica $4102_2$, replica $4101_3$ with replica $4102_3, \ldots,$ and replica $4101_n$ with replica $4102_n$ respectively. Trains of replicas in signal paths 4112 and 4122 are trains of replica pairs.

It is clear to those of ordinary skill in the art that relative separations between two members of replica pairs are same as in FIG. 41 when loop lengths of optical fiber RF delay loops in RF signal train generators 411 and 412 are the same. In pulse Doppler applications, correlation operations on replicas in pairs with same relative separations are Doppler correlations and lead to Doppler shift determinations with a single pulse.

Figure 42:
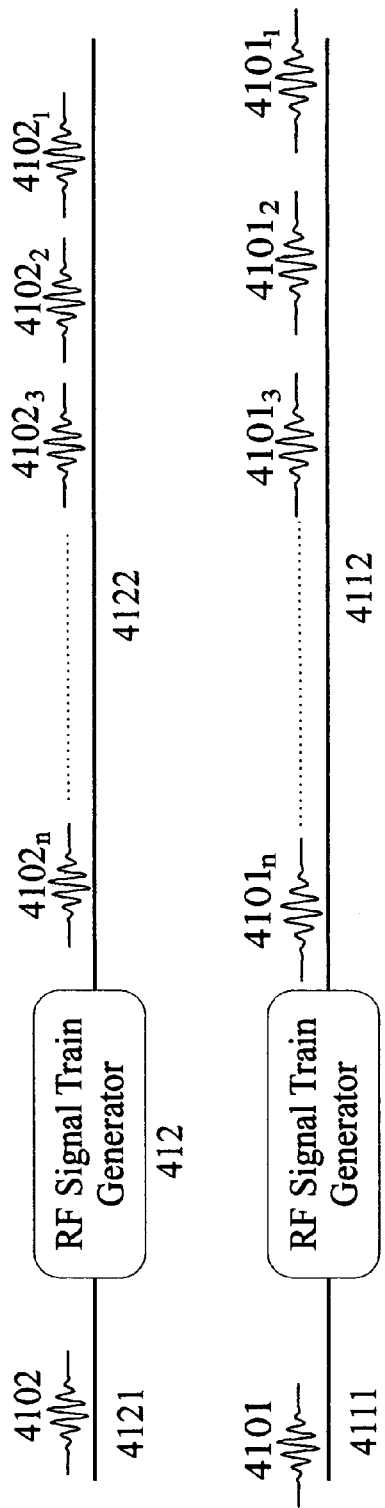
FIG. 42 shows a block diagram of the replica generation apparatus for fabricating embodiments of the present invention, where two optical fiber RF delay loops have different loop lengths.

FIG. 42 shows, in pictorial form, a block diagram of the replica generation apparatus 4200, which includes RF signal generators 411 and 412, for fabricating embodiments of the present invention. As shown in FIG. 42, the replica generation apparatus takes the input of a signal pair from the signal receiving apparatus. One signal 4101 of the pair is from signal path 4111, and the other signal 4121 from signal path 4112. RF signal train generator 411 generates a train of replicas $4101_1, 4101_2, 4101_3, \ldots, 4101_n$ from signal 4101 and outputs train of replicas through signal path 4112. RF signal train generator 412 generates another train of replicas $4102_1, 4102_2, 4102_3, \ldots, 4102_n$ from signal 4102 and outputs train of replicas through signal path 4122.

FIG. 42 is the same as FIG. 41, except that loop lengths of optical fiber RF delay loops in RF signal train generators 411 and 412 are different. As shown in FIG. 42, relative separations between two members in replica pairs are different. Correlation operations on replicas in pairs with different relative separations are self correlations when signals 4101 and 4102 are split from a single signal, and are mutual (cross) correlations when signals 4101 and 4102 are independent or have been modified.

Figure 43:
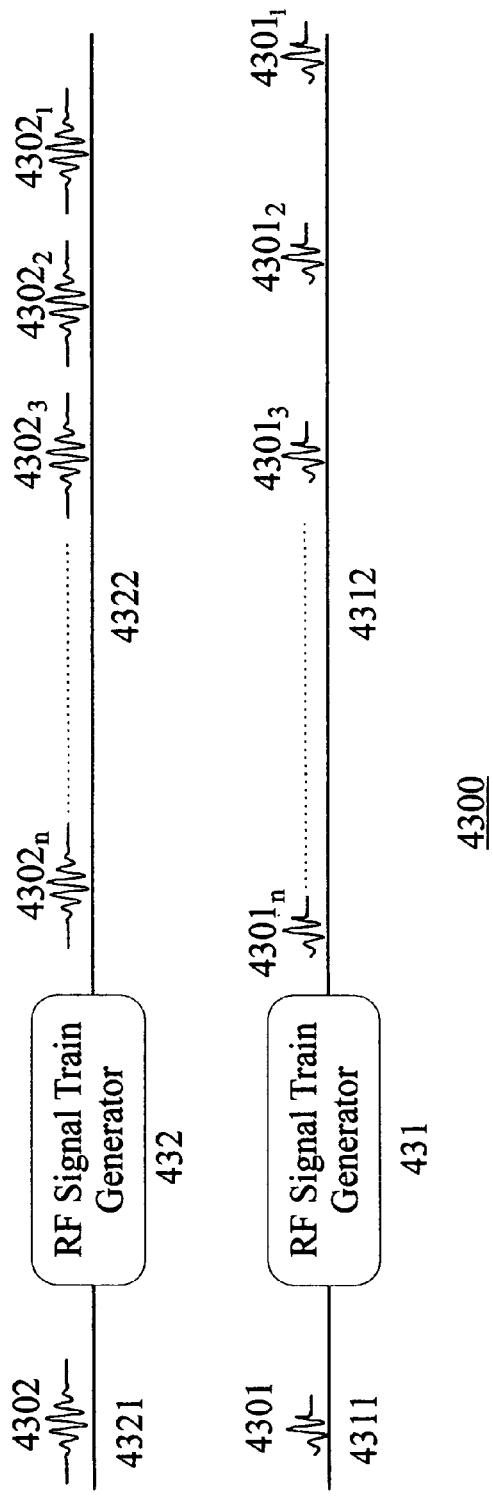
FIG. 43 shows a block diagram of the replica generation apparatus for fabricating embodiments of the present invention, where one signal is from a source of reference.

FIG. 43 shows, in pictorial form, another block diagram of the replica generation apparatus 4300, which includes RF signal generators 431 and 432, for fabricating embodiments of the present invention. As shown in FIG. 43, replica generation apparatus takes the input of a signal pair through signal paths 4311 and 4321 from the signal receiving apparatus.

RF signal train generator 431 generates a train of replicas $4301_1, 4301_2, 4301_3, \ldots, 4301_n$ from signal 4301 and outputs train of replicas through signal path 4312. RF signal train generator 432 generates another train of replicas $4302_1, 4302_2, 4302_3, \ldots, 4302_n$ from signal 4302 and outputs train of replicas through signal path 4322. As shown in FIG. 43, replica $4301_1$ pairs with replica $4302_1$, replica $4301_2$ with replica $4302_2$, replica $4301_3$ with replica $4302_3, \ldots,$ and replica $4301_n$ with replica $4302_n$ respectively. Trains of replicas in signal paths 4312 and 4322 are trains of replica pairs. Loop lengths of optical fiber RF delay loops in RF signal train generators 431 and 432 are different, and relative separations between two members in replica pairs are different. Correlation operations on replica pairs between trains of replicas $4301_1, 4301_2, 4301_3, \ldots, 4301_n$ and $4302_1, 4302_2, 4302_3, \ldots, 4302_n$ are mutual correlations.

When one signal 4301 of the pair is a known signal from source of reference and other signal 4302 is a signal of interest, mutual correlations lead to determinations on whether source of interest having a specific frequency band and/or intrinsic features as source of reference.

Figure 44:
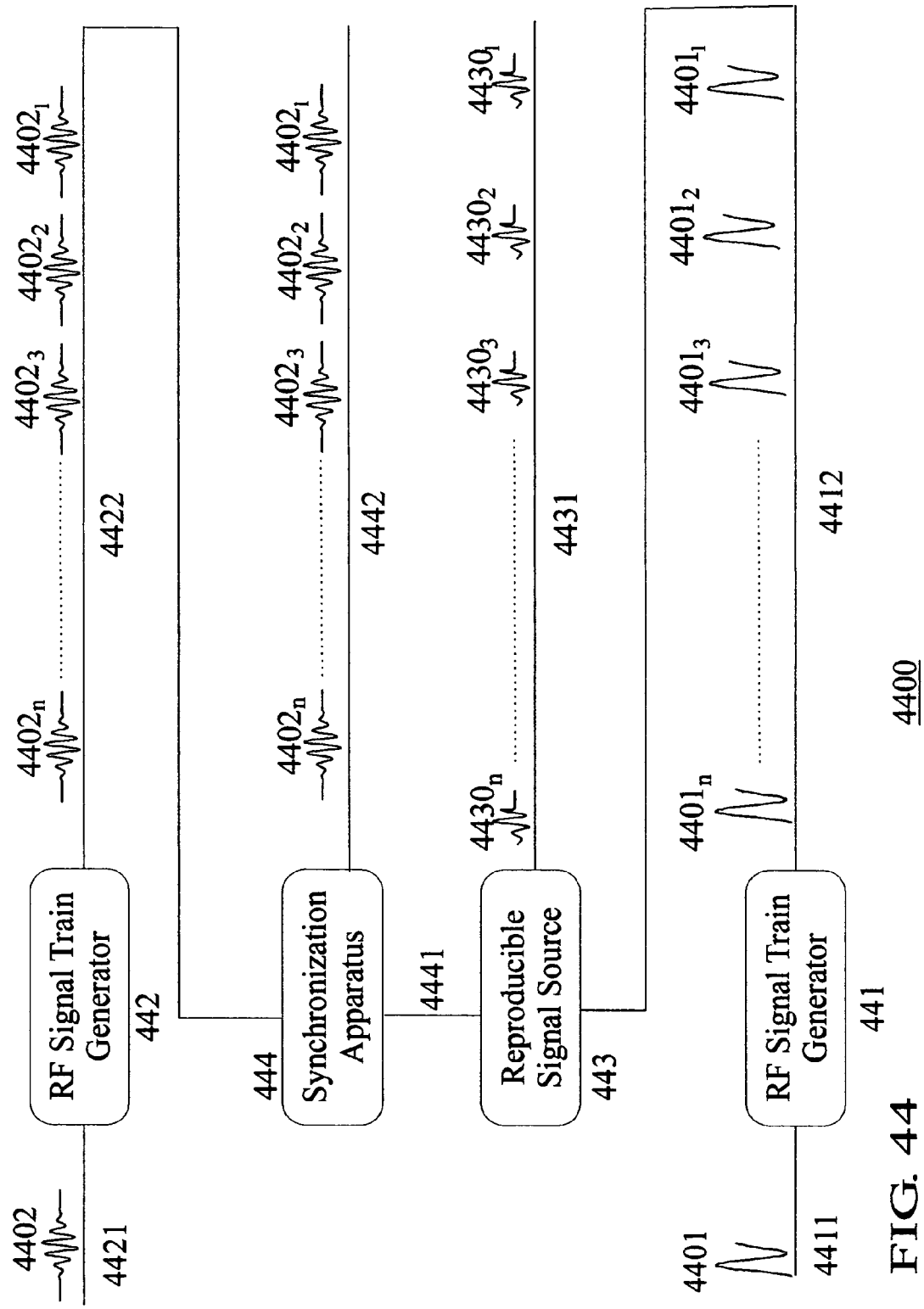
FIG. 44 shows a block diagram of the replica generation apparatus along with a reproducible signal source and synchronization apparatus for fabricating embodiments of the present invention.

FIG. 44 shows, in pictorial form, another block diagram the replica generation apparatus 4400 along with a reproducible signal source and synchronization apparatus for fabricating embodiments of the present invention. As shown in FIG. 44, the replica generation apparatus, which includes RF signal train generators 441 and 442, takes the input of a signal pair through signal paths 4411 and 4421 from the signal receiving apparatus, where one signal 4401 of the pair is a trigger signal and other signal 4402 is a signal of interest as in FIG. 28.

RF signal train generator 441 generates a train of trigger replicas $4401_1, 4401_2, 4401_3, \ldots, 4401_n$ from trigger signal 4401 and outputs train of trigger replicas through signal path 4412 to reproducible signal source 443, which reproduces identical and known pulse signals. The train of trigger replicas $4401_1, 4401_2, 4401_3, \ldots, 4401_n$ activates reproducible signal source 443 to produce a train of known signals $4430_1, 4430_2, 4430_3, \ldots, 4430_n$. Reproducible signal source 443 outputs signals $4430_1, 4430_2, 4430_3, \ldots, 4430_n$ through signal path 4431. RF signal train generator 442 generates another train of replicas $4402_1, 4402_2, 4402_3, \ldots, 4402_n$ from signal 4402 and outputs train of replicas through signal path 4422 to synchronization apparatus 441. According to information through path 4441 from reproducible signal source 443, synchronization apparatus 444 delays the train on signal path 4422 and output the delay train through signal path 4442 to pair and align with the train on signal path 4431. As shown in FIG. 44, known signal $4430_1$ pairs with replica $4402_1$, known signal $4430_2$ with replica $4402_2$, known signal $4430_3$ with replica $4402_3, \ldots,$ and known signal $4430_n$ with replica $4402_n$ respectively. Train of signals in signal path 4431 and train of replicas in signal path 4442 are trains of signal-replica pairs. Loop lengths of optical fiber RF delay loops in RF signal train generators 441 and 442 are different, and relative separations between two members of signal-replica pairs are different. Correlation operations on signal-replica pairs between trains of known signals $4430_1, 4430_2, 4430_3, \ldots, 4430_n$ and of replicas $4402_1, 4402_2, 4402_3, \ldots, 4402_n$ are mutual correlations, and lead to determinations on whether source of interest within a specific frequency band and/or intrinsic features as known signals from reproducible signal source.

There is a time lap between a trigger signal and the known signal produced by the reproducible signal source. The delay mechanism in synchronization apparatus 444 is needed to align signal-replica pairs properly for correlation operations. Different ways are possible to incorporate the delay mechanism, and are known to those of ordinary skill in the art. Thus, whenever the term delay mechanism is used herein, it is meant to be used in a most general and inclusive sense.

Figure 45:
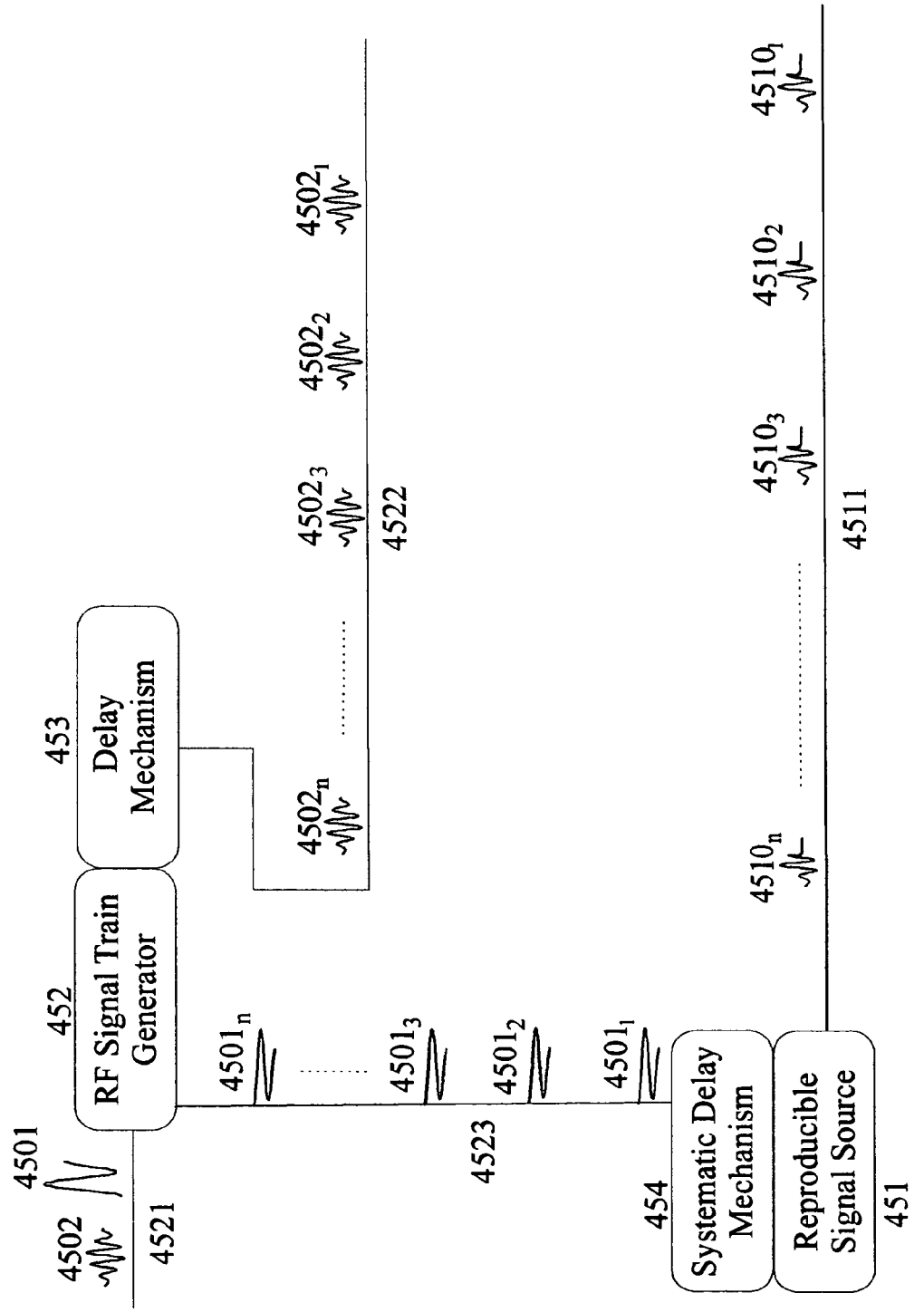
FIG. 45 shows another block diagram of the replica generation apparatus along with a reproducible signal source and synchronization apparatus for fabricating embodiments of the present invention.

FIG. 45 shows, in pictorial form, another further block diagram of the replica generation apparatus 4500 along with a reproducible signal source and synchronization apparatus for fabricating embodiments of the present invention. As shown in FIG. 45, the replica generation apparatus, which includes RF signal train generator 452, takes the input of a signal pair through signal path 4521 from the signal receiving apparatus, where one signal 4501 of the pair is a trigger signal and other signal 4502 is a signal of interest. The synchronization apparatus includes trigger replicas $4401_1, 4401_2, 4401_3, \ldots, 4401_n$, systematic delay mechanism 454 and delay mechanism 453.

RF signal train generator 452 generates a train of trigger replicas $4501_1, 4501_2, 4501_3, \ldots, 4501_n$ and outputs the train on signal path 4523. The train of trigger replicas $4501_1, 4501_2, 4501_3, \ldots, 4501_n$ on signal path 4523 with the help of systematic delay mechanism 454 activates reproducible signal source 451 to produce a train of known and identical signals $4510_1, 4510_2, 4510_3, \ldots, 4510_n$ through signal path 4511.

RF signal train generator 452 with the help of delay mechanism 453 also generates a train of replicas $4502_1, 4502_2, 4502_3, \ldots, 4502_n$ from signal 4502 and outputs the train through signal path 4522. As shown in FIG. 45, known signal $4510_1$ pairs with replica $4502_1$, known signal $4510_2$ with replica $4502_2$, known signal $4510_3$ with replica $4502_3, \ldots,$ and known signal $4510_n$ with replica $4502_n$ respectively. Train of signals in signal path 4511 and train of replicas in signal path 4522 are trains of signal-replica pairs. Systematic delay mechanism 454 leads to relative separations between two members in signal-replica pairs being systematically different. Correlation operations on signal-replica pairs between trains of signals $4510_1, 4510_2, 4510_3, \ldots, 4510_n$ and of replicas $4502_1, 4502_2, 4502_3, \ldots, 4502_n$ are mutual correlations, and lead to determinations on whether source of interest within a specific frequency band and/or intrinsic features as signals from reproducible signal source.

The systematic delay mechanism 454, which can be electronic as in a conventional sampling oscilloscope, is well known to those of ordinary skill in the art. There is a time lap between a trigger signal and the known signal produced by the reproducible signal source. The delay mechanism 453 is introduced to compensate the time lap. Mechanisms 453 and 454 of the synchronization apparatus are to pair and align signal-replica pairs on signal paths 4511 and 4522.

As those of ordinary skill in the art would appreciate that FIGS. 44 and 45 are similar in investigating source of interest. The difference between these two figures is on synchronization apparatus of signal-replica pairs. FIGS. 44 and 45 show only two examples of synchronization apparatus. Many others ways of fabricating appropriate synchronization apparatus are possible. Thus, whenever the term synchronization apparatus is used herein, it is meant to be used in a most general and inclusive sense.

Intrinsic features of extremely short pulse signals are frozen times. Due to band width limitation, at the present, RF signal train generators are not able to generate replicas of extremely short pulse signals. However, technologies are available now to reproduce identical femtosecond and sub-femtosecond pulse signals. As those of ordinary skill in the art would appreciate that, with a help of reproducible signal sources in reproducing these short pulse signals, embodiments of present invention would lead to determinations on high precision time domain characteristics of pulsed, transient, non-cooperative, non-reproducible, complex, or simultaneous signals.

A sampling oscilloscope with the help of a prior art interferoceiver also leads to time domain characteristics of pulsed, transient, non-cooperative, non-reproducible, complex, or simultaneous signals. However there are differences. The sampling oscilloscope relies on sampling and holding of RF digitizers. The short sampling gate pulse is basically a digital pulse. The digitized signal strength, which arises from sampling and holding, is independent of the amplitude of the digital pulse. In the present invention, the short pulse is an analog pulse, and the correlated signal strength depends on its amplitude. The short analog pulse has many forms and variations. Due to these fundamental differences, it is anticipated that the art of present invention has many advantages over the sampling oscilloscope.

In accordance with the present invention, in order to achieve various objectives of interests, signals may be from multiple paths and form pairs with a number of variations. Further embodiments of the present invention comprise combinations of the embodiments shown in FIGS. 41-45 to generate replica and signal-replica pairs. It should be noted that trains of replica and/or signal-replica pairs as depicted in FIGS. 41-45 are for illustration only and not in scale.

Figure 46:
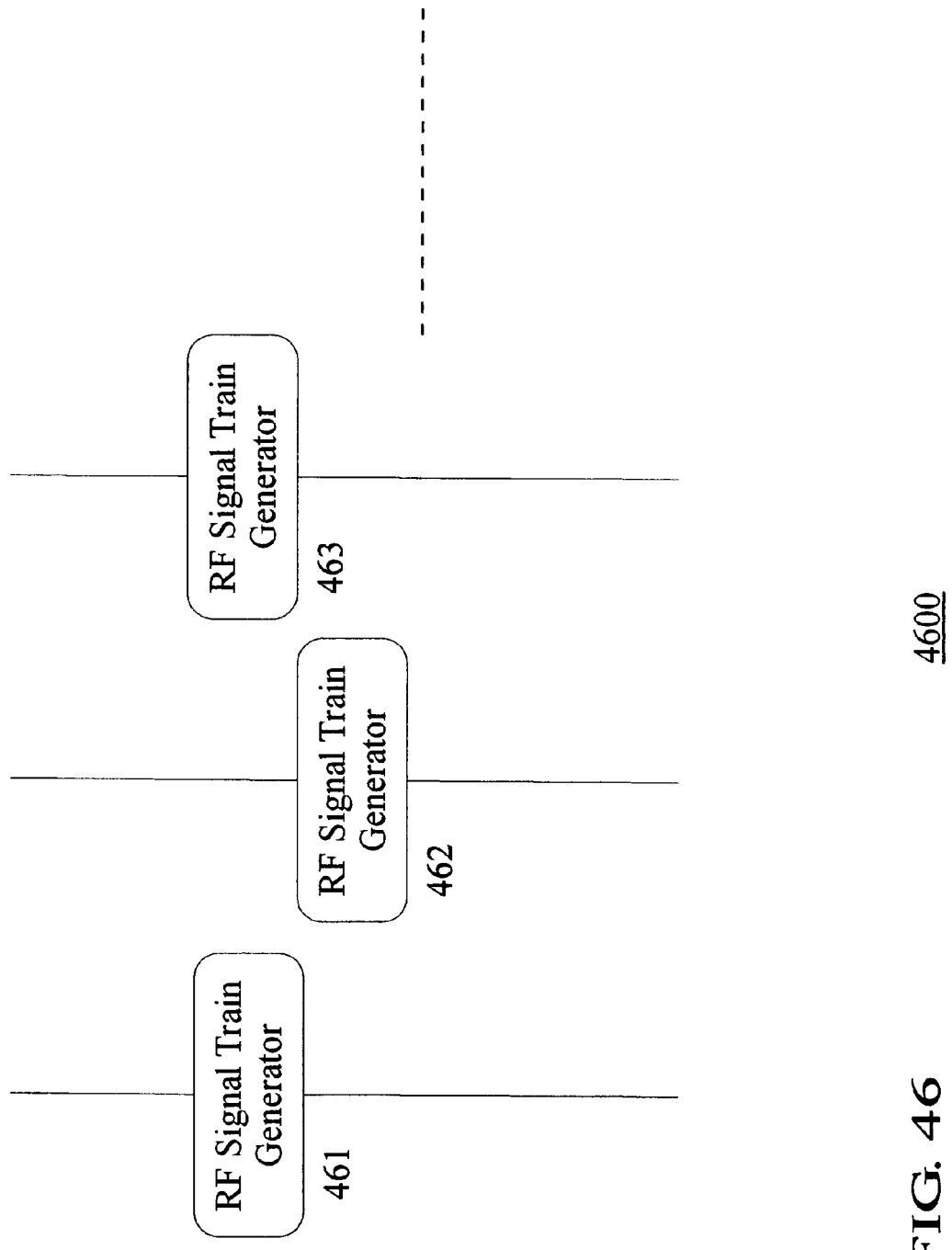
FIG. 46 shows another block diagram of the replica generation apparatus with multiple RF signal train generators.

FIG. 46 shows, in pictorial form, a block diagram of the replica generation apparatus 4600 for fabricating embodiments of the present invention. As shown in FIG. 46, the replica generation apparatus includes a number of RF signal train generators 461, 462, 463 . . . . These generators might operate in parallel or in series for simultaneous or sequential determinations on various signatures from one or more signals of interest. Multiple generators are needed for high resolution ISAR images. A number of these generators might share a common single optical fiber recirculation loop through wave division multiplex, which divides the loop to many channels for replica productions. Thus, whenever the term replica generation apparatus is used herein, it is meant to be used in a most general and inclusive sense.

Figure 51:
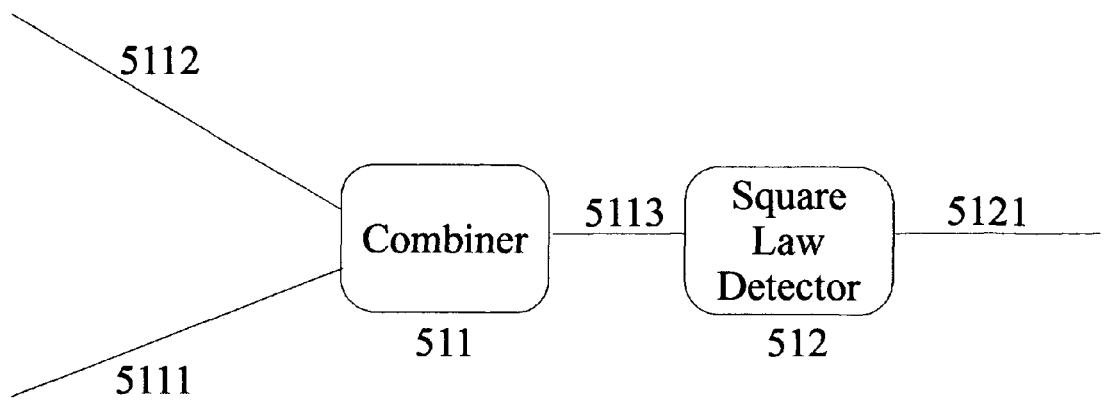
FIG. 51 shows a block diagram of the integration apparatus under the help of a square law detector for fabricating embodiments of the present invention.

FIG. 51 shows, in pictorial form, a block diagram of the integration apparatus 5100, which includes combiner 511 and square law detector 512, for fabricating embodiments of the present invention. As shown in FIG. 51, the integration apparatus takes trains of replica pairs or signal-replica pairs through signal paths 5111 and 5112 as inputs. Combiner 511 combines train on signal path 5111 with train on signal path 5112 to form a single train of replica pairs or signal-replica pairs, and outputs through signal path 5113. Square law detector 512 detects intensities of replica pairs or signal-replica pairs from signal path 5113 and outputs a train of intensity signals on signal path 5121. Apparatus of combiner and square law detector are well known to those of ordinary skill in the art.

Figure 52:
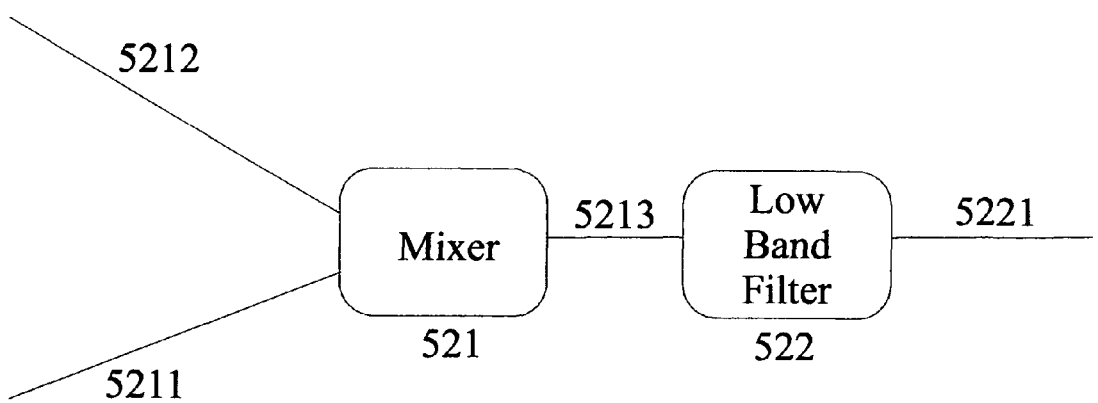
FIG. 52 shows a block diagram of the integration apparatus with the help of a mixer for fabricating embodiments of the present invention.

FIG. 52 shows, in pictorial form, another block diagram of the integration apparatus 5200, which includes mixer 521 and low band filter 522, for fabricating embodiments of the present invention. As shown in FIG. 52, the integration apparatus takes trains of replica pairs or signal-replica pairs through signal paths 5211 and 5212 as inputs. Mixer 521 mixes train on signal path 5211 with train on signal path 5212 to form a single train of replica pairs or signal-replica pairs, and outputs through signal path 5213. Low band filter 522 filters out high frequency signals from mixing of replica pairs or signal-replica pairs from signal path 5213, and outputs a train of low frequency signals through signal path 5221. Apparatus of mixer and low band filter are well known to those of ordinary skill in the art.

The combiner, mixer, square law detector, and low band are available in both RF and optical level. As those of ordinary skill in the art would appreciate that the correlation operations would be carried out at RF or optical level in accordance with interests.

As those of ordinary skill in the art would further appreciate that output signals of the integration apparatus through signal path 5121 or signal path 5221 have slow time variations which are usually referred to as base band or video signals. Block diagrams of FIGS. 51 and 52 are examples of the integration apparatus, which may include a number of those as in FIGS. 51 and 52 especially in parallel processing. In accordance with the present invention, the integration apparatus is to evaluate overlapped intensity variations of replica pairs or signal-replica pairs.

A mathematical description of the integration apparatus for evaluating overlapped intensity variations is explained from Eq. (7) through Eqs. (37) to (41) in Ref. (1) "A High Precision Doppler Radar Based on Optical Fiber Delay Loops". The detected intensity Eq. (7) is expressed in the frequency domain (see Ref. (2) "Radar Receivers Based on Correlation Measurements"). It can be also expressed in time domain through Fourier transformation. The relation of these two expressions is usually referred to as Parseval's theorem. The intensity variations in Eq. (41) is a function of circulation number n', hence it is time dependent variations. Thus, whenever the term integration apparatus is used herein, it is meant to be used in a most general and inclusive sense. The output of the integration apparatus represents the time domain characteristics of pulsed, transient, non-cooperative, non-reproducible, complex, or simultaneous signals.

The intensity variations are explained in the three references articles. Eq. (41) indicated in the above paragraph is resulted from Doppler correlation. The intensity variations can also come from self and mutual correlations. All these variations have a general form, which is summarized here. Replicas output from replica generation apparatus are pulsed. Each replica contain many frequency components. Every component $\omega$ has its own amplitude which is described by magnitude $\alpha$ and phase $\phi(\omega,n)$ $$A(\omega,n)=\alpha \mathrm{Exp}[-i\phi(\omega,n)] \qquad (1)$$

The phase $\phi(\omega, n)$ is a functions of recirculation number n. The interfering amplitude for a paired replicas is $$A_1(\omega,n)S_1(\omega)+A_2(\omega,n)S_2(\omega) \qquad (2)$$

where $S(\omega)$ is referred to as the spread function of a replica pulse. Subscripts 1 and 2 denote individual members in a replica pair. The detected intensity is $$\int dw |A_1(\omega,n)S_1(\omega)+A_2(\omega,n)S_2(\omega)|^2 \qquad (3)$$

which is the integration with respect to magnitude square of the interfering amplitude. The intensity variations for paired replicas arise from the phase difference in the cross terms of Eq. (3). The three reference articles provide detail discussions on how to evaluate phase differences for various Doppler, self and mutual correlations. Anyone, who is interested in the present art, should read these articles.

Fourier processor performs a Fourier transformation on output signals of the integration apparatus by the use of any one of a number of methods that are known to those of ordinary skill in the art, for example, by the use of Fast Fourier Transform (FFT) techniques. Thus, whenever the term Fourier processor is used herein, it is meant to be used in a most general and inclusive sense.

The output of the Fourier transformation represents the frequency domain characteristics of pulsed, transient, non-cooperative, non-reproducible, complex, or simultaneous signals on their Doppler shifts, frequencies, pulse widths, component distributions, interferences, or other intrinsic signatures. Furthermore, the output represents information on Doppler distribution and/or down range profile in scattering process. For a target with rotational motion, the output represents its Doppler cross range, silhouette image, or ISAR image.

As was described above, source of interest, source of interference, apparatus of interference, radar emitter, target of interest, tap, stable oscillator, pulse forming apparatus, amplifier, mixer, source of trigger, trigger signals, signal divider, delay adjust apparatus, signal separator, optical fiber recirculation loop, RF signal train generator, reproducible signal source, delay mechanism, delay adjustment apparatus, systematic delay mechanism, synchronization apparatus, combiner, square law detector, low band filter, and so forth are basic devices of embodiments of the present invention. It should be understood that such devices can be fabricated in a number of ways and that they may even be integrated to form simpler devices. Such integrated devices can take different forms. For instance, an optical fiber recirculation loop, a delay mechanism, a delay adjustment mechanism, and a synchronization apparatus may be comprised of an optical fiber recirculation loop with taps; a delay mechanism, a delay adjustment mechanism, and a synchronization apparatus may be comprised of a tapped delay line or a pair of parallel and movable mirrors. Thus, whenever a term of these devices are used herein, it is meant to be used in a most general and inclusive sense.

As those of ordinary skill in the art would appreciate that the apparatus of present invention advance interferoceivers of prior art, and overcome deficiencies of radar receivers, channelized receivers, electronic warfare receivers, spectrum analyzers, sampling oscilloscopes, and many others.

Those skilled in the art will recognize that the forgoing description has been presented for the sake of illustration and description only, as such, it is not intended to be exhaustive or to limit the invention to the precise form disclosed.

What is claimed is:

1. An apparatus for processing one or more signals which comprises:
    a signal receiving apparatus configured to receive the one or more signals, and outputs one or more further signals;
    a replica generation apparatus configured to receive the one or more further signals from the signal receiving apparatus as input and output one or more trains of replica pairs of signals; and
    an integration apparatus configured to receive the one or more trains of replica pairs of signals as input, perform optical or radio frequency (RF) integration operations on and evaluate intensity variations of the replica pairs of signals, and output the intensity variations; wherein an integration operation is an integration with respect to a magnitude square of an interfering amplitude for a paired replica.

2. The apparatus of claim 1 further comprising a Fourier processor;
    wherein the Fourier processor receives intensity variations from the integration apparatus as input and Fourier analyzes the intensity variations.

3. The apparatus of claim 2 wherein after analyzing the intensity variations the Fourier processor further outputs information indicating signal contamination of the one or more signals by: sources of interference and apparatus of interference.

4. The apparatus of claim 2 wherein after analyzing intensity variations the Fourier processor outputs silhouette or ISAR images.

5. The apparatus of claim 1 wherein the signal receiving apparatus comprises one or more delay adjustment apparatus, which are responsive to one or more of the one or more signals to align one or more of the one or more further signals.

6. The apparatus of claim 1
    wherein one or more of the one or more signals received by the signal receiving apparatus are one or more signals of interest from one or more sources of interest.

7. The apparatus of claim 6 further comprising a source of reference;
    wherein the source of reference outputs one or more signals of reference to the signal receiving apparatus;
    wherein the signal receiving apparatus is responsive to receive the one or more signals from the source of reference.

8. The apparatus of claim 1 further comprising:
    a source which transmits one or more source signals to a target of interest and outputs the one or more source signals;
    a tap which receives the one or more source signals from the source as input, taps out portions of the one or more source signals, and outputs one or more tapped signals; and
    wherein one or more of the one or more signals received by the signal receiving apparatus are one or more scattered signals from the target of interest and the one or more tapped signals from the tap.

9. The apparatus of claim 8 further comprising:
    a stable oscillator which outputs a continuous signal;
    a first mixer which receives and mixes one of the one or more tapped signals from the tap and the continuous signal from the stable oscillator, and outputs a first mixed-signal;
    a coherent oscillator which receives and locks to the first mixed signals from the first mixer as input and outputs a locked signal;
    a second mixer which receives and mixes the locked signal from the coherent oscillator and the continuous signal from the stable oscillator; wherein the second mixer outputs a second mixed signal with time delays;
    a pulse forming apparatus which receives and converts the second mixed signal from the second mixer and outputs a pulsed signal; and
    wherein one of the one or more signals received by the signal receiving apparatus is the pulsed signal from the pulse forming apparatus.

10. The apparatus of claim 1 further comprising:
    a stable oscillator which outputs a continuous signal;
    a first pulse forming apparatus which receives the continuous signal from the stable oscillator as input, converts the continuous signal to pulsed signals, and outputs pulsed signals;
    an amplifier which receives the pulsed signals from the first pulse forming apparatus as input, amplifies and transmits amplified pulsed signals to a target of interest;
    a second pulse forming apparatus which receives the continuous signal from the stable oscillator as input, and outputs second pulsed signals; and
    wherein one or more of the one or more signals received by the signal receiving apparatus are scattered signals from the target of interest and the second pulsed signals from the second pulse forming apparatus.

11. The apparatus of claim 1 wherein the signal receiving apparatus is adapted to receive at least one of optical, infrared, acoustical, electromagnetic, mechanical, or nuclear signals.

12. The apparatus of claim 1 wherein the replica generation apparatus comprises one or more RF signal train generators, which comprise recirculation loops with same or different loop lengths.

13. The apparatus of claim 1 wherein the integration apparatus comprises one or more of: combiner-square law detector and mixer-low band filter pairs.

14. The apparatus of claim 1 further comprising a source of trigger, a reproducible source, and a synchronization apparatus;

wherein the source of trigger outputs trigger signals;

wherein the replica generation apparatus further receives the trigger signals from the source of trigger and outputs trigger replicas to the reproducible source;

wherein the reproducible source receives the trigger replicas as input, produces identical pulsed signals in reference to the trigger replicas, and outputs the identical pulsed signals and trigging information signals;

wherein the replica generation apparatus further outputs unpaired replicas from one of the one or more further signals as received from the signal receiving apparatus;

wherein the synchronization apparatus receives the trigging information signals from the reproducible source and the unpaired replicas from the replica generation apparatus as input, aligns the unpaired replicas with the identical pulsed signals_, and outputs the train of replicas to pair with the identical pulsed signals; and wherein the integration apparatus receives the identical pulsed signals from the reproducible source and the train of replicas from the synchronization apparatus as input, and evaluate intensity variations of identical pulsed signal and replica pairs.

15. An apparatus for processing one of more signals which comprises:
   a signal receiving apparatus configured to receive the one or more signals, and output one or more further signals;
   a replica generation apparaturs configured to accept which accepts the one or more further signals from the signal receiving apparatus as input, and output one or more trains of replicas;
   one or more reproducible signal sources configured to output one or more trains of identical pulsed signals;
   a synchronization apparatus through linked signal paths configured to synchronize the identical pulsed signals in the one or more trains of identical pulsed signals with the replicas in the one or more trains of replicas to form identical pulsed signal and replica pairs; and
   an integration apparatus configured to receive the one or more trains of identical pulsed signals from the one or more reproducible signal sources and the one or more trains of identical replicas from the replica generation as input, wherein the integration apparatus is configured to perform optical or radio frequency (RF) integration operations on and evaluate intensity variations of the identical pulsed signal and replica pairs; and wherein an integration operation is an integration with respect to a magnitude square of an interfering amplitude for a paired replica.

16. The apparatus of claim 15 wherein the synchronization apparatus comprises one or more systematic delay mechanisms.

17. A method of processing one or more signals which comprises:
   receiving one or more signals;
   generating one or more trains of replicas of the one or more signals;
   pairing the replicas to form one or more trains of replica pairs of signals;
   performing optical or radio frequency (RF) integration operations on and
   evaluating intensity variations of the paired replicas; wherein an integration operation is an integration with respect to a magnitude square of an interfering amplitude for a paired replica.

18. The method of claim 17 further comprising:
   emitting one or more signals to a target of interest for scattering;
   tapping portions of signals from the one or more signals; and
   wherein the receiving comprises receiving scattered signals of the emitting one or more signals by the target and the tapped portions of signals.

19. The method of claim 17 further comprising:
   emitting identical pulsed signals;
   synchronizing the identical pulsed signals with replicas to form aligned signal-replica pairs; and
   wherein the evaluating intensity variations comprise evaluating intensity variations of signal-replica pairs.

20. The method of claim 17 further comprising steps of:
   forming first pulsed signals from a continuous signal;
   receiving scattered signals of the first pulsed signals by a target;
   forming second pulsed signals from the same continuous signal;
   synchronizing the second pulsed signals with scattered signals by the target; and
   wherein the receiving comprises receiving the scattered signals and the second pulsed signals.

* * * * *